United States Patent
Neill et al.

(10) Patent No.: US 9,492,991 B2
(45) Date of Patent: *Nov. 15, 2016

(54) ENCAPSULATION OF ELECTRICALLY ENERGIZED ARTICLES

(75) Inventors: Ryan Thomas Neill, Kingsport, TN (US); Gary Wayne Hartley, Kingsport, TN (US); Michael Eugene Donelson, Kingsport, TN (US); Theodore Robert Trautman, Avon, CT (US); John Walker Gilmer, Kingsport, TN (US); James Collins Maine, Church Hill, TN (US); Bryan Steven Bishop, Kingsport, TN (US); Robert Erik Young, Kingsport, TN (US)

(73) Assignee: Eastman Chemical Company, Kingsport, TN (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/487,474

(22) Filed: Jun. 4, 2012

(65) Prior Publication Data

US 2013/0143052 A1 Jun. 6, 2013

Related U.S. Application Data

(62) Division of application No. 11/827,696, filed on Jul. 13, 2007, now abandoned.

(60) Provisional application No. 60/849,409, filed on Oct. 4, 2006.

(51) Int. Cl.
*B29C 65/02* (2006.01)
*B32B 3/00* (2006.01)
(Continued)

(52) U.S. Cl.
CPC ............. *B32B 37/06* (2013.01); *B32B 37/185* (2013.01); *B29C 65/02* (2013.01); *B29C 66/133* (2013.01);
(Continued)

(58) Field of Classification Search
None
See application file for complete search history.

(56) References Cited

U.S. PATENT DOCUMENTS

| | | | |
|---|---|---|---|
| 2,991,273 A | 7/1961 | Hechelhammer et al. | |
| 2,999,835 A | 9/1961 | Goldberg | |

(Continued)

FOREIGN PATENT DOCUMENTS

| | | | |
|---|---|---|---|
| DE | 4415432 A1 | 11/1995 | |
| EP | 0271288 A2 | 6/1988 | |

(Continued)

OTHER PUBLICATIONS

USPTO Office Action Dated Feb. 6, 2014 for Co-pending U.S. Appl. No. 13/167,123.

(Continued)

*Primary Examiner* — Vivian Chen
(74) *Attorney, Agent, or Firm* — Tammye L. Taylor

(57) ABSTRACT

In one aspect the present invention relates to a method of making an encapsulated electrically energized device, the method comprising: providing a first layer and a second layer each independently comprising a copolyester, a polycarbonate, a polyacrylate, polycarbonate/polyester miscible blends, or mixtures thereof, providing the electrically energized between the first and second layer, thermocompressively fusing the first layer and the second layer to encapsulate the electrically energized device by applying pressure at a temperature, sufficient to form the article, to a perimeter of the surface of the first and second layers, wherein the perimeter does not overlap the electrically energized device, wherein the temperature at the interface of the first and second layers is equal to or greater than Tg of the first layer and the second layer, and wherein the polyester layers have a flow during encapsulation less than the flow that induces fractures in the electrically energized device.

20 Claims, 2 Drawing Sheets

(51) Int. Cl.
| | | |
|---|---|---|
| *B32B 7/04* | (2006.01) | |
| *B32B 27/36* | (2006.01) | |
| *B32B 27/30* | (2006.01) | |
| *B32B 37/00* | (2006.01) | |
| *B32B 37/16* | (2006.01) | |
| *B32B 37/18* | (2006.01) | |
| *H01L 31/048* | (2014.01) | |
| *H01L 33/52* | (2010.01) | |
| *H01L 31/049* | (2014.01) | |
| *G09F 13/22* | (2006.01) | |
| *C08L 33/04* | (2006.01) | |
| *C08L 67/02* | (2006.01) | |
| *C08L 67/03* | (2006.01) | |
| *C08L 69/00* | (2006.01) | |
| *B32B 37/06* | (2006.01) | |
| *B29C 65/00* | (2006.01) | |
| *B32B 27/08* | (2006.01) | |

(52) U.S. Cl.
CPC ............ *B29C 66/43* (2013.01); *B29C 66/433* (2013.01); *B29C 66/71* (2013.01); *B29C 66/72* (2013.01); *B29C 66/731* (2013.01); *B29C 66/737* (2013.01); *B29C 66/739* (2013.01); *B29C 66/7311* (2013.01); *B29C 66/7312* (2013.01); *B29C 66/7352* (2013.01); *B29C 66/73117* (2013.01); *B29C 66/73921* (2013.01); *B32B 3/00* (2013.01); *B32B 7/045* (2013.01); *B32B 27/08* (2013.01); *B32B 27/308* (2013.01); *B32B 27/36* (2013.01); *B32B 27/365* (2013.01); *B32B 37/0007* (2013.01); *B32B 37/0046* (2013.01); *B32B 37/0076* (2013.01); *B32B 37/16* (2013.01); *B32B 37/182* (2013.01); *B32B 2309/02* (2013.01); *B32B 2309/04* (2013.01); *B32B 2309/12* (2013.01); *B32B 2333/04* (2013.01); *B32B 2367/00* (2013.01); *B32B 2369/00* (2013.01); *B32B 2457/00* (2013.01); *B32B 2457/08* (2013.01); *B32B 2457/10* (2013.01); *B32B 2457/12* (2013.01); *B32B 2457/20* (2013.01); *B32B 2457/202* (2013.01); *B32B 2457/206* (2013.01); *C08L 33/04* (2013.01); *C08L 67/02* (2013.01); *C08L 67/03* (2013.01); *C08L 69/00* (2013.01); *G09F 13/22* (2013.01); *H01L 31/049* (2014.12); *H01L 31/0481* (2013.01); *H01L 33/52* (2013.01); *H01L 2933/005* (2013.01); *Y10T 428/161* (2015.01); *Y10T 428/162* (2015.01); *Y10T 428/163* (2015.01); *Y10T 428/239* (2015.01); *Y10T 428/31507* (2015.04); *Y10T 428/31786* (2015.04); *Y10T 428/31797* (2015.04); *Y10T 428/31928* (2015.04); *Y10T 428/31935* (2015.04)

(56) References Cited

U.S. PATENT DOCUMENTS

| | | |
|---|---|---|
| 2,999,846 A | 9/1961 | Schnell et al. |
| 3,028,365 A | 4/1962 | Schnell et al. |
| 3,148,172 A | 9/1964 | Fox |
| 3,153,008 A | 10/1964 | Fox |
| 3,169,121 A | 2/1965 | Goldberg |
| 3,207,814 A | 9/1965 | Goldberg |
| 3,271,367 A | 9/1966 | Schnell et al. |
| 3,396,067 A | 8/1968 | Schafer |
| 3,502,620 A | 3/1970 | Caldwell |
| 3,546,008 A | 12/1970 | Shields et al. |
| 3,734,874 A | 5/1973 | Kibler et al. |
| 3,772,405 A | 11/1973 | Hamb |
| 4,025,492 A | 5/1977 | Binsack et al. |
| 4,029,837 A | 6/1977 | Leatherman |
| 4,111,846 A | 9/1978 | Elliott, Jr. |
| 4,123,436 A | 10/1978 | Holub et al. |
| 4,136,089 A | 1/1979 | Bier et al. |
| 4,156,069 A | 5/1979 | Prevorsek et al. |
| 4,176,224 A | 11/1979 | Bier et al. |
| 4,188,314 A | 2/1980 | Fox et al. |
| 4,194,038 A | 3/1980 | Baker et al. |
| 4,208,527 A | 6/1980 | Horlbeck et al. |
| 4,217,440 A | 8/1980 | Barkey |
| 4,228,209 A | 10/1980 | Chavannes |
| 4,233,196 A | 11/1980 | Sublett |
| 4,238,593 A | 12/1980 | Duh |
| 4,263,364 A | 4/1981 | Seymour et al. |
| 4,289,818 A | 9/1981 | Casamayor |
| 4,370,293 A * | 1/1983 | Petersen-Hoj ............... 264/514 |
| 4,373,002 A * | 2/1983 | Petersen-Hoj ............... 428/213 |
| 4,391,954 A | 7/1983 | Scott |
| 4,430,484 A | 2/1984 | Quinn |
| 4,433,070 A | 2/1984 | Ross et al. |
| 4,452,933 A | 6/1984 | McCready |
| 4,465,820 A | 8/1984 | Miller et al. |
| 4,474,918 A | 10/1984 | Seymour et al. |
| 4,503,023 A | 3/1985 | Breck et al. |
| 4,544,584 A | 10/1985 | Ross et al. |
| 4,721,883 A * | 1/1988 | Jacobs ................. H05B 33/10 313/505 |
| 4,733,488 A | 3/1988 | Yokoyama et al. |
| 4,734,617 A * | 3/1988 | Jacobs ................. H05B 33/12 313/506 |
| 4,786,692 A | 11/1988 | Allen et al. |
| 4,786,693 A | 11/1988 | Hefner, Jr. |
| 4,918,156 A | 4/1990 | Rogers |
| 4,946,932 A | 8/1990 | Jenkins |
| 4,981,898 A | 1/1991 | Bassett |
| 4,982,014 A | 1/1991 | Freitag et al. |
| 5,010,162 A | 4/1991 | Serini et al. |
| 5,051,654 A | 9/1991 | Nativi et al. |
| 5,055,076 A * | 10/1991 | Mori et al. ..................... 445/25 |
| 5,059,470 A | 10/1991 | Fukuda et al. |
| 5,091,258 A | 2/1992 | Moran |
| 5,228,925 A | 7/1993 | Nath et al. |
| 5,260,379 A * | 11/1993 | Blakely et al. ............... 525/173 |
| 5,286,290 A | 2/1994 | Risley |
| 5,290,631 A | 3/1994 | Fleury et al. |
| 5,321,056 A * | 6/1994 | Carson et al. ................ 523/201 |
| 5,413,840 A | 5/1995 | Mizuno |
| 5,413,870 A | 5/1995 | Mizuno |
| 5,442,036 A | 8/1995 | Beavers et al. |
| 5,443,912 A | 8/1995 | Olson |
| 5,445,871 A | 8/1995 | Murase et al. |
| 5,461,120 A | 10/1995 | Mason et al. |
| 5,478,896 A | 12/1995 | Scott |
| 5,480,926 A | 1/1996 | Fagerburg et al. |
| 5,492,589 A | 2/1996 | Mizuno |
| 5,527,989 A | 6/1996 | Leeb |
| 5,543,488 A | 8/1996 | Miller et al. |
| 5,552,495 A | 9/1996 | Miller et al. |
| 5,583,394 A * | 12/1996 | Burbank ................ H05B 33/02 313/498 |
| 5,633,340 A | 5/1997 | Hoffman et al. |
| 5,643,666 A | 7/1997 | Eckart et al. |
| 5,646,237 A | 7/1997 | George et al. |
| 5,654,347 A | 8/1997 | Khemani et al. |
| 5,688,738 A | 11/1997 | Lu |
| 5,696,176 A | 12/1997 | Khemani et al. |
| 5,709,929 A | 1/1998 | Venema |
| 5,709,940 A | 1/1998 | George et al. |
| 5,739,463 A | 4/1998 | Diaz et al. |
| 5,742,006 A | 4/1998 | Grupp et al. |
| 5,814,393 A | 9/1998 | Miyaake et al. |
| 5,834,118 A | 11/1998 | Ranby et al. |
| 5,894,048 A | 4/1999 | Eckart et al. |
| 5,955,565 A * | 9/1999 | Morris et al. ................ 528/271 |
| 5,957,564 A | 9/1999 | Bruce et al. |
| 5,958,539 A | 9/1999 | Eckart et al. |
| 5,972,445 A * | 10/1999 | Kimura et al. ............... 428/35.4 |

(56) References Cited

U.S. PATENT DOCUMENTS

| | | | |
|---|---|---|---|
| 5,998,028 A | 12/1999 | Eckart et al. | |
| 6,025,069 A | 2/2000 | Eckart et al. | |
| 6,043,322 A | 3/2000 | Scott et al. | |
| 6,136,441 A | 10/2000 | MacGregor et al. | |
| 6,162,890 A | 12/2000 | George et al. | |
| 6,165,037 A * | 12/2000 | Van Zant | A63H 33/22 446/219 |
| 6,214,155 B1 | 4/2001 | Leighton | |
| 6,322,862 B1 | 11/2001 | Sakai | |
| 6,543,208 B1 * | 4/2003 | Kobayashi et al. | 53/452 |
| 6,637,906 B2 * | 10/2003 | Knoerzer et al. | 362/84 |
| 6,698,085 B2 | 3/2004 | Stevenson et al. | |
| 6,743,327 B2 * | 6/2004 | Schober | 156/309.6 |
| 6,803,110 B2 | 10/2004 | Drees et al. | |
| 6,896,966 B2 | 5/2005 | Crawford et al. | |
| 6,917,301 B2 * | 7/2005 | Blum et al. | 340/815.4 |
| 6,924,349 B2 * | 8/2005 | Lee et al. | 528/272 |
| 6,949,825 B1 | 9/2005 | Guenther et al. | |
| 7,002,388 B2 | 2/2006 | Nishikawa et al. | |
| 7,008,700 B1 * | 3/2006 | Goodson et al. | 428/542.2 |
| 7,022,388 B2 * | 4/2006 | Hashimoto et al. | 428/34.9 |
| 7,038,372 B2 * | 5/2006 | Yuki et al. | 313/504 |
| 7,074,501 B2 | 7/2006 | Czeremuszkin et al. | |
| 7,081,300 B2 | 7/2006 | Laurence et al. | |
| 7,118,799 B2 | 10/2006 | Crawford et al. | |
| 7,298,072 B2 | 11/2007 | Czeremuszkin et al. | |
| 7,510,768 B2 | 3/2009 | Crawford et al. | |
| 7,550,057 B1 | 6/2009 | Goodson et al. | |
| 7,691,470 B2 | 4/2010 | Goodson et al. | |
| 7,704,605 B2 | 4/2010 | Crawford et al. | |
| 7,740,941 B2 | 6/2010 | Crawford et al. | |
| 7,906,211 B2 | 3/2011 | Crawford et al. | |
| 7,906,212 B2 | 3/2011 | Crawford et al. | |
| 8,217,869 B2 * | 7/2012 | Weisberg et al. | 345/84 |
| 8,287,991 B2 * | 10/2012 | Donelson et al. | 428/200 |
| 2002/0012807 A1 * | 1/2002 | Kurian | B29C 47/0026 428/480 |
| 2002/0055586 A1 | 5/2002 | Dalgewicz, III et al. | |
| 2003/0152775 A1 | 8/2003 | Gorny et al. | |
| 2004/0053040 A1 | 3/2004 | Goodson et al. | |
| 2004/0101678 A1 * | 5/2004 | Crawford et al. | 428/339 |
| 2004/0101687 A1 | 5/2004 | Crawford et al. | |
| 2004/0209020 A1 | 10/2004 | Castiglione et al. | |
| 2005/0137542 A1 * | 6/2005 | Underhill et al. | 604/361 |
| 2006/0046034 A1 * | 3/2006 | Schober | 428/195.1 |
| 2006/0132427 A1 * | 6/2006 | Weisberg et al. | 345/107 |
| 2006/0249715 A1 | 11/2006 | Salyer et al. | |
| 2008/0085390 A1 | 4/2008 | Neill et al. | |
| 2009/0017320 A1 | 1/2009 | Donelson et al. | |
| 2009/0105380 A1 | 4/2009 | Neill et al. | |
| 2010/0174030 A1 | 7/2010 | Crawford et al. | |
| 2011/0144266 A1 | 6/2011 | Crawford et al. | |
| 2012/0157636 A1 | 6/2012 | Neill et al. | |

FOREIGN PATENT DOCUMENTS

| | | |
|---|---|---|
| EP | 0408042 A2 | 1/1991 |
| EP | 0587353 A1 | 3/1994 |
| EP | 0595413 A1 | 5/1994 |
| FR | 2467691 A1 | 4/1981 |
| GB | 1356004 | 6/1974 |
| GB | 1 599 230 A | 9/1981 |
| GB | 2344596 A | 6/2000 |
| JP | 052338 | 2/1997 |
| JP | 2004-276320 * | 10/2004 |
| WO | WO 9425502 A1 | 11/1994 |
| WO | WO 01/53393 A1 | 7/2001 |
| WO | WO 02/068511 A1 | 9/2002 |
| WO | WO 2008/042224 A1 | 4/2008 |
| WO | WO 2008/042226 A1 | 4/2008 |

OTHER PUBLICATIONS

USPTO Office Action dated Oct. 24, 2014 for copending U.S. Appl. No. 13/167,123.
ASTM D-1238; "Standard Test Method for Melt Flow Rates of Thermoplastics by Extrusion Plastometer" (undated).
Wilfrong, R.E.; "Linear Polyesters"; Journal of Polymer Science; vol. 54, pp. 385-410 (1961).
Mohn, R.N., et al.; "Polyester-Polycarbonate Blends. III. Polyesters Based on 1,4- Cyclohexanedimethanol/Terephthalic Acid/ Isophthalic Adic"; Journal of Applied Polymer Science, vol. 23, 575-587 (1979).
Research Disclosure 22921, May 1983, Disclosed Anonymously (209,136).
Notification of Transmittal of the International Search Report and the Written Opinion of the International Searching Authority, or the Declaration, filed Sep. 27, 2007 (PCT/US2007/020859).
Notification of Transmittal of the International Search Report and the Written Opinion of the International Searching Authority, or the Declaration, filed Sep. 27, 2007.
Notification of Transmittal of the International Search Report and the Written Opinion of the International Searching Authority, or the Declaration, for International Application No. PCT/US2008/011727 with Date of Mailing Feb. 13, 2009.
ASTM D1003; "Standard Test Method for Haze and Luminous Transmittance of Transparent Plastics" (2000).
ASTM G155; "Standard Practice for Operating Xenon Arc Light Apparatus for Exposure of Non-Metallic Materials" (2005).
ASTM D256; "Standard Test Methods for Determining the Izod Pendulum Impact Resistance of Plastics" (2006).
ASTM D3418; "Standard Test Method for Transition Temperatures and Enthalpies of Fusion and Crystallization of Polymers by Differential Scanning Calorimetry" (2004).
Copending U.S. Appl. 11/827,905, filed Jul. 13, 2007.
USPTO Office Action dated Jan. 21, 2011 for copending U.S. Appl. 11/827,905.
USPTO Office Action dated Jul. 7, 2011 for copending U.S. Appl. 11/827,905.
Copending U.S. Appl. 11/876,305, filed Oct. 22, 2007.
USPTO Office Action dated Apr. 5, 2011 for copending U.S. Appl. 11/876,305.
USPTO Office Action dated Oct. 21, 2011 for copending U.S. Appl. 11/876,305.
USPTO Office Action dated Feb. 28, 2012 for copending U.S. Appl. 11/827,905.
ASTM D3433 (2012).
ASTM D1925 (1970).
ASTM D2857-95 (2007).
ASTM 4603 (2012).
Co-pending U. S. Appl. No. 13/167,123, filed Jun. 23, 2011; Neil et al.; now U. S. Publication No. 2012-032884.
Notice of Allowance and Fee(s) Due dated Jun. 29, 2015 received in U. S. Appl. No. 13/167,123.
Notification of Transmittal of the International Search Report and the Written Opinion of the International Search Authority with a mailing date of Aug. 9, 2012, International application No. PCT/US2012/041455.
Notification of Transmittal of the International Search Report and the Written Opinion of the International Searching Authority, or the Declaration, for International Application No. PCT/US2007/020869 with Date of Mailing Jan. 25, 2008.

* cited by examiner

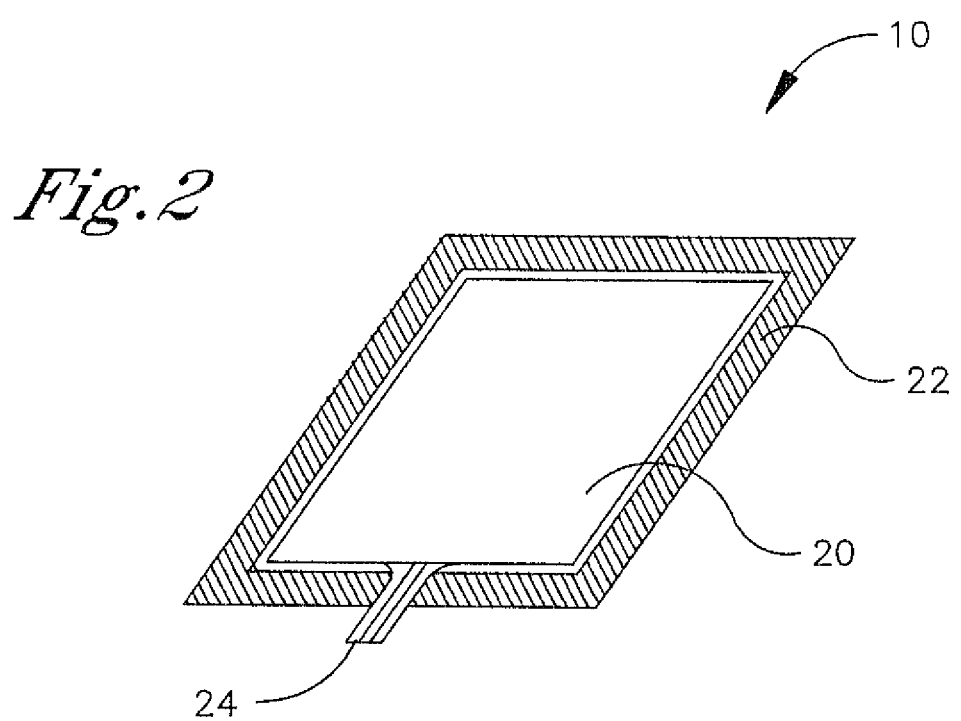

ENCAPSULATION OF ELECTRICALLY ENERGIZED ARTICLES

RELATED APPLICATION DATA

This application is a divisional of Ser. No. 11/827,696 filed 13 Jul. 2007, entitled, ENCAPSULATION OF ELECTRICALLY ENERGIZED ARTICLES, and claims benefit of provisional application U.S. Ser. No. 60/849,409 filed 4 Oct. 2006, which are fully incorporated by reference.

FIELD OF INVENTION

This invention relates to thermoplastic articles comprising electrically energized materials and devices encapsulated between polymer sheet and methods of making the articles. In particular, this invention relates to methods of encapsulation of light emitting materials and devices encapsulated, by lamination, between polymer sheets comprising a polyester, a polycarbonate, a polyacrylate, or a polycarbonate/polyester miscible blend and the articles made therefrom.

BACKGROUND OF THE INVENTION

Various methods are known for encapsulation of decorative and functional items between sheet made from polyesters, polycarbonates, polyacrylates or polycarbonate/polyester miscible blends. Electrically energized materials, including devices, have been made by encapsulation with various polymers, but the devices often have poor resistance to weathering, particularly environmental moisture. Attempts of solve this problem have included the use of adhesive layers for sheet lamination, which also helps to prevent moisture penetration between layers and the use of additional moisture-resistant polymer layers in addition to the initial encapsulation layers. One problem with this approach is that adhesives typically have low glass transition temperatures (Tg) and the adhesive bonding of sheets often fails under temperatures approaching the Tg of the adhesive. These solutions increase the cost of the encapsulate devices. These problems are magnified when the electrically energized materials or devices have a large surface area, for example, greater than one square foot. Furthermore, many of the known encapsulation techniques use combinations of times, temperatures and pressures that degrade or destroy the electrically energized devices, particularly when the electrically energized devices have a large surface area.

A need exists for methods to encapsulate temperature and pressure sensitive electrically energized materials and devices with relatively thick protective polymeric layers, particularly those devices having a large surface area.

BRIEF SUMMARY OF THE INVENTION

In one aspect the present invention relates to a method of making an encapsulated electrically energized device, the method comprising:
(a) providing a first layer and a second layer each independently comprising a copolyester,
(b) providing the electrically energized device having a surface area ranging from greater than 1 square foot (0.093 square meters) and less than 120 square feet (11.2 square meters) between the first and second layer
(c) thermocompressively fusing the first layer and the second layer to encapsulate the electrically energized device by applying pressure ranging from 5 psig to 350 psig at a temperature ranging from 180 F to 245 F for a period ranging from 5 minutes to 45 minutes to the surface of the first and second layers,
wherein the first and second layer each independently ranges from 15 mil to 375 mil in thickness,
wherein the temperature at an interface of the first and second layers is equal to or greater than Tg of the first layer and the second layer, and
wherein the first layer and the second layer increase in width and/or length less than 5% relative to the initial width or length of the first and second layer.

In another aspect the present invention relates to a method of making an encapsulated electrically energized device, the method comprising:
(a) providing a first layer and a second layer each independently comprising a copolyester,
(b) providing the electrically energized device having a surface area ranging from greater than 1 square foot (0.93 square meters) and less than 120 square feet (11.2 square meters) between the first and second layer
(c) thermocompressively fusing the first layer and the second layer to encapsulate the electrically energized device by applying pressure ranging from 5 psig to 350 psig at a temperature ranging from 180 F to 245 F for a period ranging from 5 minutes to 45 minutes to the surface of the first and second layers,
wherein the first and second layer each independently ranges from 15 mil to 375 mil in thickness,
wherein the temperature at an interface of the first and second layers is equal to or greater than Tg of the first layer and the second layer, and
wherein the polyester layers have a flow during encapsulation less than the flow that induces fractures in the electrically energized device.

In another aspect the present invention relates to a method of making an encapsulated electrically energized device, the method comprising:
(a) providing a first layer and a second layer each independently comprising a copolyester,
(b) providing the electrically energized device having a surface area ranging from greater than 1 square foot (0.93 square meters) and less than 120 square feet (11.2 square meters) between the first and second layer
(c) thermocompressively fusing the first layer and the second layer to encapsulate the electrically energized device by applying pressure ranging from 5 psig to 350 psig at a temperature ranging from 180 F to 245 F for a period ranging from 5 minutes to 45 minutes to the surface of the first and second layers,
wherein the first and second layer each independently ranges from 15 mil to 375 mil in thickness,
wherein the temperature at an interface of the first and second layers is equal to or greater than Tg of the first layer and the second layer, and
wherein the polyester layers have a flow during encapsulation less than the flow that induces burn-through in the electrically energized device.

In another aspect the present invention relates to a method of making an encapsulated electrically energized device, the method comprising:
(a) providing a first layer and a second layer each independently comprising a polyester, a polycarbonate, a polyacrylate, or a polycarbonate/polyester miscible blend,
(b) providing the electrically energized device having a surface area ranging from greater than 1 square foot (0.93 square meters) and less than 120 square feet (11.2 square meters) between the first and second layer (c) thermocompressively fusing the first layer and the second layer to encapsulate the electrically energized device by applying pressure ranging from 5 psig to 750 psig at a temperature ranging from 180 F to 425 F for a period ranging from 5 minutes to 45 minutes to a perimeter of the surface of the first and second layers, wherein the perimeter does not overlap the electrically energized device, wherein the first and second layer each independently ranges from 15 mil to 375 mil in thickness, wherein the temperature at an interface of the first and second layers is equal to or greater than Tg of the first layer and the second layer, and wherein the first layer and the second layer increase in width and/or length less than 5% relative to the initial width or length of the first and second layer.

In another aspect the present invention relates to a method of making an encapsulated electrically energized device, the method comprising:

(a) providing a first layer and a second layer each independently comprising a copolyester, a polycarbonate, a polyacrylate, polycarbonate/polyester miscible blends, or mixtures thereof, (b) providing the electrically energized device having a surface area ranging from greater than 1 square foot (0.93 square meters) and less than 120 square feet (11.2 square meters) between the first and second layer (c) thermocompressively fusing the first layer and the second layer to encapsulate the electrically energized device by applying pressure ranging from 5 psig to 750 psig at a temperature ranging from 180 F to 425 F for a period ranging from 5 minutes to 45 minutes to a perimeter of the surface of the first and second layers, wherein the perimeter does not overlap the electrically energized device, wherein the first and second layer each independently ranges from 15 mil to 375 mil in thickness, wherein the temperature at an interface of the first and second layers is equal to or greater than Tg of the first layer and the second layer, and wherein the polyester layers have a flow during encapsulation less than the flow that induces fractures in the electrically energized device.

In another aspect the present invention relates to a method of making an encapsulated electrically energized device, the method comprising:

(a) providing a first layer and a second layer each independently comprising a copolyester, a polycarbonate, a polyacrylate, polycarbonate/polyester miscible blends, or mixtures thereof, (b) providing the electrically energized device, having a surface area ranging from greater than 1 square foot (0.93 square meters) and less than 120 square feet (11.2 square meters), between the first and second layer (c) thermocompressively fusing the first layer and the second layer to encapsulate the electrically energized device by applying pressure ranging from 5 psig to 750 psig at a temperature ranging from 180 F to 425 F for a period ranging from 5 minutes to 45 minutes to a perimeter of the surface of the first and second layers, wherein the perimeter does not overlap the electrically energized device, wherein the first and second layer each independently ranges from 15 mil to 375 mil in thickness, wherein the temperature at an interface of the first and second layers is equal to or greater than Tg of the first layer and the second layer, and wherein the polyester layers have a flow during encapsulation less than the flow that induces burn-through in the electrically energized device.

In other aspects the present invention relates to an article comprising:

a) a first layer and a second layer comprising a polyester, a polycarbonate, a polyacrylate, or a polycarbonate/polyester miscible blend;

b) an electrically energized device having a surface area ranging from greater than 1 square foot (0.93 square meters) and less than 120 square feet (11.2 square meters) encapsulated between the first and second layer;

wherein the first and second layer are the same or different, wherein the first and second layers each independently have a thickness ranging from 15 mil to 375 mil, and wherein the article remains moisture resistant after immersion in water at 25° C. for 500 hours while continuously energized.

In another aspect the present invention relates to a method of making an encapsulated electrically energized device, the method comprising:

(a) providing a first layer and a second layer each independently comprising a polyester, a polycarbonate, a polyacrylate, or a polycarbonate/polyester miscible blend, (b) providing the electrically energized device having a surface area ranging from greater than 1 square foot (0.93 square meters) and less than 120 square feet (11.2 square meters) between the first and second layer (c) thermocompressively fusing the first layer and the second layer to encapsulate the electrically energized device by applying pressure ranging from 5 psig to 750 psig at a temperature ranging from 180 F to 425 F for a period ranging from 5 minutes to 45 minutes to a perimeter of the surface of the first and second layers, wherein the perimeter does not substantially overlap the electrically energized device, wherein the first and second layer each independently ranges from 15 mil to 375 mil in thickness, wherein the temperature at an interface of the first and second layers is equal to or greater than Tg of the first layer and the second layer, and wherein the first layer and the second layer increase in width and/or length less than 5% relative to the initial width or length of the first and second layer.

In another aspect the present invention relates to a method of making an encapsulated electrically energized device, the method comprising:

(a) providing a first layer and a second layer each independently comprising a copolyester, a polycarbonate, a polyacrylate, polycarbonate/polyester miscible blends, or mixtures thereof, (b) providing the electrically energized device having a surface area ranging from greater than 1 square foot (0.93 square meters) and less than 120 square feet (11.2 square meters) between the first and second layer (c) thermocompressively fusing the first layer and the second layer to encapsulate the electrically energized device by applying pressure ranging from 5 psig to 750 psig at a temperature ranging from 180 F to 425 F for a period ranging from 5 minutes to 45 minutes to a perimeter of the surface of the first and second layers, wherein the perimeter does not substantially overlap the electrically energized device, wherein the first and second layer each independently ranges from 15 mil to 375 mil in thickness, wherein the temperature at an interface of the first and second layers is equal to or greater than Tg of the first layer and the second layer, and wherein the polyester layers have a flow during encapsulation less than the flow that induces fractures in the electrically energized device.

In another aspect the present invention relates to a method of making an encapsulated electrically energized device, the method comprising:

(a) providing a first layer and a second layer each independently comprising a copolyester, a polycarbonate, a polyacrylate, polycarbonate/polyester miscible blends, or mixtures thereof, (b) providing the electrically energized device, having a surface area ranging from greater than 1 square foot (0.93 square meters) and less than 120 square feet (11.2 square meters), between the first and second layer (c) thermocompressively fusing the first layer and the second layer to encapsulate the electrically energized device by applying pressure ranging from 5 psig to 750 psig at a temperature ranging from 180 F to 425 F for a period ranging from 5 minutes to 45 minutes to a perimeter of the surface of the first and second layers, wherein the perimeter does not substantially overlap the electrically energized device, wherein the first and second layer each independently ranges from 15 mil to 375 mil in thickness, wherein the temperature at an interface of the first and second layers is equal to or greater than Tg of the first layer and the second layer, and wherein the polyester layers have a flow during encapsulation less than the flow that induces burn-through in the electrically energized device.

In another aspect the invention relates to an article comprising:

a) a first layer and a second layer comprising a polyester, polycarbonate, polyacrylate or polycarbonate/polyester miscible blends;

b) an electrically energized device having a surface area ranging from greater than about 1 square foot (0.93 square meters) and less than about 120 square feet (11.2 square meters) encapsulated between the first and second layer;

wherein the first and second layer are the same or different, wherein the first and second layers each independently have a thickness ranging from 15 mil to 375 mil, and wherein the article remains moisture resistant after immersion in water at 25° C. for 500 hours while continuously energized.

In one aspect the processes of the present invention provide articles that are moisture resistant after immersion in water at 25 C for 500 hours while continuously energized. "Immersion" refers to the encapsulated electrically energized device, but not the electrical connector or plug. In certain embodiments, the electrical connector or plug may be partially embedded in the laminate structure.

In another aspect the processes of the present invention provide articles that function after ten cycles in an environmental chamber cycling through a relative humidity ranging from 3% to 100% during a 320 hour period.

In another aspect the processes of the present invention provide articles that function after ten cycles in an environmental chamber cycling through a temperature ranging from minus 20 F to 130 F during a 320 hour period.

In another aspect the processes of the present invention provide articles that function after ten cycles in an environmental chamber cycling through a relative humidity ranging from 3% to 100% during a 320 hour period and that function after ten cycles in an environmental chamber cycling through a temperature ranging from minus 20 F to 130 F during a 320 hour period.

In one aspect the energized electrical devices have a surface area ranging from 1 square foot to 120 square feet, or 5 square feet to 120 square feet, or 10 square feet to 120 square feet, or 25 square feet to 120 square feet, or 50 square feet to 120 square feet, or 75 square feet to 120 square feet or 100 square feet to 150 square feet. In another aspect, the energized electrical devices have a surface area ranging from 1 square foot to 6 square feet, or 1 square foot to 12 square feet, or 1 square foot to 32 square feet.

In one aspect the invention relates to methods of making a laminated article comprising providing a first layer and a second layer, each layer independently comprising a copolyester layer, wherein at least one layer further comprises a branching agent, providing an electrically energized device between the first and second layer, applying pressure ranging from about 20 to about 400 psig at a temperature ranging from about 20° C. to about 80° C. above the glass transition (Tg) of at least one layer of the copolyester for a period of time ranging from about 0.5 minutes to about 120 minutes to form the laminated article, wherein the temperature at an interface of the first layer and the second layer is equal to or greater than the Tg of at least one of the first layer and the second layer, and wherein the copolyester has an inherent viscosity (IV) ranging from about 0.5 to about 1.2 dL/g, when measured at 25° C. using 0.50 grams of polymer per 100 mL of a solvent consisting of 60 weight percent phenol and 40 weight percent tetrachloroethane.

In one aspect the invention relates to a laminated article comprising a first layer and a second layer, each layer independently comprising a copolyester layer, wherein at least one layer further comprising a branching agent, and an electrically energized device between the first and second layer, wherein the copolyester has an inherent viscosity (IV) ranging from about 0.5 to about 1.2 dL/g, when measured at 25° C. using 0.50 grams of polymer per 100 mL of a solvent consisting of 60 weight percent phenol and 40 weight percent tetrachloroethane and wherein the article is prepared by applying pressure ranging from about 20 to about 400 psig at a temperature ranging from about 20° C. to about 80° C. above the glass transition (Tg) of at least one layer of the copolyester for a period of time ranging from about 0.5 minutes to about 120 minutes to form the laminated article, wherein the temperature at an interface of the first layer and the second layer is equal to or greater than the Tg of at least one of the first layer and the second layer.

In one aspect of the invention the electrically energized device comprises an LEC have a color temperature ranging from 7500 to 11,000 degrees Kelvin or 5000 to 11,000 degrees Kelvin or 5000 to 8000 degrees Kelvin or 5000 to 7500 degrees Kelvin. In one embodiment of the invention, the electrically energized device comprises an LEC powered to illuminate from 100 cd/m$^2$ to 200 cd/m$^2$, or 100 cd/m$^2$ to 300 cd/m$^2$, or 200 cd/m$^2$ to 300 cd/m$^2$.

In one aspect of the invention, the perimeter frame does not substantially overlap with the electrically energized device encapsulated in the laminate structure, which means the frame does not overlap more than about 1.0 inch or preferably about 0.5 inch per side or edge or circumference of the electrically energized device.

In one aspect of the invention, the processes result in a flow of the polymer layers that is less than the flow that induces fractures in the electrically energized device. For example, in LEC the fractures appear as striations in the LEC surface and cause reduced light output or failure of the LEC. These striations are most easily seen on the non-illuminating side of the LEC panel, especially in configurations where the metalized shielding film has been removed prior to encapsulation.

In one aspect of the invention, the processes result in a flow of the polymer layers that is less than the flow that induces burn-through in the electrically energized device. For example, pin point burn-through in an LEC results in holes burned in the LEC when energized. The burn-through may also cause delamination near the burn-through.

In one aspect of the invention, the processes further comprise providing a power supply to the electrically energized device to form an electrically energized system. In another aspect of the invention, the articles further comprise a power supply to the electrically energized device to form an electrically energized system.

In one aspect of the invention, the first layer and the second layer comprise different polymers. In another aspect of the invention, the first layer and the second layer independently comprise different copolyesters.

BRIEF DESCRIPTION OF THE DRAWINGS

FIG. 2 is a top view of an encapsulation layup having a perimeter lamination press.

DETAILED DESCRIPTION

Figure 1A:
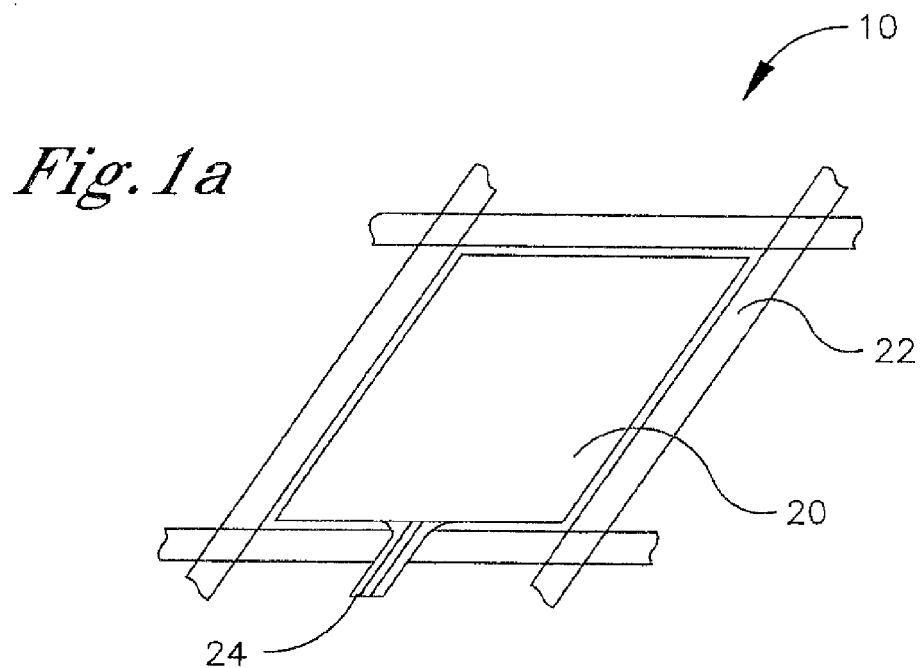
FIG. 1a is the top view of an encapsulation layup showing optional shims around an LEC panel.

The present invention may be understood more readily by reference to the following detailed description of certain embodiments of the invention, Figures and the working examples. In accordance with the purpose(s) of this invention, certain embodiments of the invention are described in the Summary of the Invention and are further described herein below. Also, other embodiments of the invention are described herein.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, each numerical parameter should at least be construed in light of the number of reported significant digits and by applying ordinary rounding techniques. Further, the ranges stated in this disclosure and the claims are intended to include the entire range specifically and not just the endpoint(s). For example, a range stated to be 0 to 10 is intended to disclose all whole numbers between 0 and 10 such as, for example 1, 2, 3, 4, etc., all fractional numbers between 0 and 10, for example 1.5, 2.3, 4.57, 6.1113, etc., and the endpoints 0 and 10. Also, a range associated with chemical substituent groups such as, for example, "$C_1$ to $C_5$ hydrocarbons", is intended to specifically include and disclose $C_1$ and $C_5$ hydrocarbons as well as $C_2$, $C_3$, and $C_4$ hydrocarbons. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements.

The term "polyester", as used herein, is intended to include "copolyesters" and is understood to mean a synthetic polymer prepared by the reaction of one or more difunctional carboxylic acids and/or multifunctional carboxylic acids with one or more difunctional hydroxyl compounds and/or multifunctional hydroxyl compounds. Typically the difunctional carboxylic acid can be a dicarboxylic acid and the difunctional hydroxyl compound can be a dihydric alcohol such as, for example, glycols and diols. The term "glycol" as used in this application includes, but is not limited to, diols, glycols, and/or multifunctional hydroxyl compounds. Alternatively, the difunctional carboxylic acid may be a hydroxy carboxylic acid such as, for example, p-hydroxybenzoic acid, and the difunctional hydroxyl compound may be an aromatic nucleus bearing 2 hydroxyl substituents such as, for example, hydroquinone. The term "residue", as used herein, means any organic structure incorporated into a polymer through a polycondensation and/or an esterification reaction from the corresponding monomer. The term "repeating unit", as used herein, means an organic structure having a dicarboxylic acid residue and a diol residue bonded through a carbonyloxy group. Thus, for example, the dicarboxylic acid residues may be derived from a dicarboxylic acid monomer or its associated acid halides, esters, salts, anhydrides, or mixtures thereof. Furthermore, as used in this application, the term "diacid" includes multifunctional acids such as branching agents. As used herein, therefore, the term dicarboxylic acid is intended to include dicarboxylic acids and any derivative of a dicarboxylic acid, including its associated acid halides, esters, half-esters, salts, half-salts, anhydrides, mixed anhydrides, or mixtures thereof, useful in a reaction process with a diol to make polyester. As used herein, the term "terephthalic acid" is intended to include terephthalic acid itself and residues thereof as well as any derivative of terephthalic acid, including its associated acid halides, esters, half-esters, salts, half-salts, anhydrides, mixed anhydrides, or mixtures thereof or residues thereof useful in a reaction process with a diol to make polyester. The terms "polyacrylates", "polyacrylics", "acrylates" and "acrylics" are used interchangeably to indicate polymeric materials derived from monomers including, but not limited to, methyl methacrylate, methyl acrylate, acrylonitrile, and acrylic acid. The term "thermo-compressive" refers to a process of applying both heat and pressure during the lamination process.

The electrically energized devices include, but are not limited to, light emitting capacitors (LEC's), light emitting diodes (LED's), printed "circuit boards" that emit light when energized, electrochromic layers, photovoltaics, transmitters, receivers, antennas, electromagnets, electrodes and smart sensors capable of detecting wind speed and direction, temperature, pressure, relative humidity, rainfall, motion, radiation, specific chemical species or combinations thereof. Furthermore, a light emitting panel, comprising an electrically energized device, which typically emits light over its entire surface area, can be altered such that only portions of the panel emit light. This can be accomplished by physically removing (e.g., die cutting, laser cutting, etc.) sections of the electrically energized device from the panel or by applying the luminescent phosphor in the shape of specific patterns such that only the intended shape fluoresces. In some embodiments two LECs or other electrically energized devices can be encapsulated back-to-back such that both sides of the panels are "active," i.e., perform the function of the device. For example, certain embodiments of the present invention may comprise a flat, flexible light panel made from light emitting capacitors. This flat, flexible light panel technology involves a parallel plate capacitor (two plates make up one parallel plate capacitor) which causes a sandwiched layer of "phosphor" to fluoresce when energized. This flexible light panel is relatively fragile when exposed to outdoor conditions and needs additional protection to survive in these environments such as the protection provided by the present invention.

The thermoplastic articles of this invention can be used, for example, in the manufacture of billboard signage, backlit bus advertisement, street furniture, bus shelters, POP (point-of-purchase) displays, flooring, kiosks, smart sensors, decorative walls, partitions, glazing applications and other areas, especially where backlighting is important. In one aspect of the present invention, the thermoplastic articles are thermoformable according to methods known in the art of thermoforming.

As shown in FIG. 1a an encapsulation layup may use shims "f" around an LEC panel "e" to reduce or eliminate gaps between the encapsulation sheets, which reduces or eliminates air trapped during the encapsulation process. These shims are typically clear polymeric films of the same composition as the upper and/or lower sheet materials and are typically of about the same thickness as the LEC panel.

Air entrapment abatement techniques include, but are not limited to, using matte sheet, with the matte side facing the encapsulated item, with an "Ra" or surface roughness measurement of about 110 micro inches, where the preferred surface roughness value depends on the type of inclusion being encapsulated, or using vacuum assisted air removal, such as vacuum bagging techniques, or by inserting "glass sheen" or similar fabrics to create channels for air escape, where the fabrics are almost transparent after encapsulation.

Figure 1B:
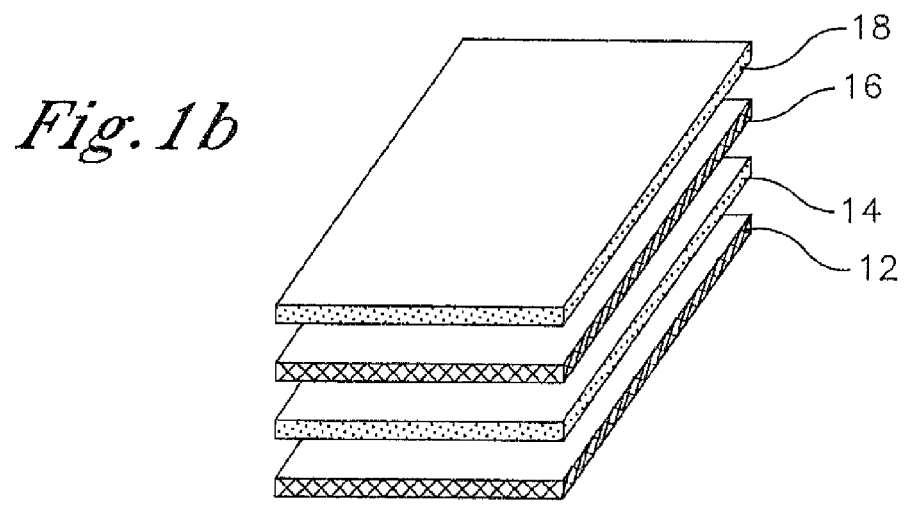
FIG. 1b is a side view of half of an encapsulation layup.

As shown in FIG. 1b, layer "a" is a padding that used to equalize the platen pressure. Layer "a" is used for platens that are not completely flat or that deflect or bow when pressure is applied. Layer "b" is a metallic caul plate. Layer "c" is a release film or paper. Layer "d" is a polymeric sheet with optional matte surface facing the LEC panel to aid air removal. Layer "e" is a LEC (light emitting capacitor) panel, for example an 8.5"×11" LEC. For panels greater than about 10 mils thick, optional polymeric film shims (layer "f") can be used to equalize the thickness across the laminate surface further aiding air removal. FIG. 1a shows an electrical lead "h" extending beyond the edge of the lamination. The electrical plug can also be molded into the laminate using conventional techniques. To complete the layup, repeat layers "d" through "a" in reverse order on top of the LEC panel (top section of the layup not shown).

As shown in FIG. 2, layers "a," "b," "c," "d," and "e" are as described for FIG. 1a. Layer "g" is typically a polished chrome plate of about the same thickness or several mils thicker than the LEC panel with center removed from the chrome plate. During the layup, layer "g" is inserted between layers "c" and "d" so that the plate of layer "g" is not encapsulated.

In some embodiments of the present invention, a metallic frame is used to preferentially redistribute the pressure to the edges of the laminate around the panel. Such a process, using a pressure frame with the center removed, in some embodiments according to the present invention allows even higher temperature and pressure conditions applied to the perimeter of the laminated structure, since the relatively fragile panel doesn't experience the same conditions. If the metal frame is several mils thicker than the LEC panel, then the panel experiences essentially no pressure and is laminated in a cavity or pocket. This perimeter frame process is advantageous for pressure-sensitive electrical structures, or objects that become pressure-sensitive at elevated temperatures by applying a reduced force on the pressure-sensitive portion of the laminated structure. In some embodiments using this perimeter frame process the thermocompressive lamination techniques discussed herein, except using a 15 to 50 mil thick metal polished "frame" or pressure plate 0.5 to 12 inches, or 0.5 to 10 inches, or 1 to 8 inches, or 1 to 6 inches, or 1 to 3 inches wide on all sides (center cut out), or wider depending on the width of the frame needed, to preferentially concentrate the force to the lamination perimeter and away from the pressure-sensitive structure. For encapsulated items having a thickness greater than 50 mils, then a correspondingly thicker pressure plate used.

In one aspect the present invention also involves the lamination of an electrical plug into the final structure in which the electric plug, "h" in FIG. 1, extends beyond the sheet of the encapsulated structure. The electrically energized structure often needs to be physically connected to a power source which may be any conventional power supply, such as an inverter. A low-profile (i.e., relatively flat) connector can be encapsulated into the laminate structure at the edge for an aesthetically pleasing, easy to install panel. In one embodiment of the present invention, the lamination method described herein encapsulates the desired edges on a plug when the plug is included in the layup. Alternatively, the sheet can be notched or cut out such that the plug is recessed at the laminate edge in the layup prior to sealing. A lamination tool can also be devised to ensure proper access to the plug face after lamination. For example, if a male-type plug is part of the encapsulation, the lamination tool would involve encapsulation with a female-type of tool joined to the male plug such that the male to female connection is close to the edge of the layup. Release sprays, films or female part material composition could be used to aid lamination tool removal after part cooling.

The sheet material from which the upper (or outer) layer or surface is formed generally has a thickness in the range of about 0.015-0.375 inch, preferably in the range of about 0.030-0.125 inch. The sheet material from which the lower (or backing) layer or surface is formed typically has a thickness in the range of 0.015-0.375 inch, preferably in the range of about 0.030-0.125 inch.

In one aspect of the present invention, the thermoplastic article of the present invention may be produced by subjecting the laminate to temperatures and pressures sufficient to cause the upper or lower sheet materials to bond (or fuse) around the electrically energized layer. Although the upper and lower sheet may also bond to the electrically energized layer, this is not required for the present invention. However, temperatures which cause decomposition, distortion, or other undesirable effects in the finished article or sheet material, should be avoided. The lamination temperatures are typically measured at the interface of the sheets being laminated together. Typically, the bonding temperatures are in the range of about 80 to 218° C. (176 to 425° F.), preferably in the range of about 82 to 118° C. (180 to 245° F.). For certain embodiments of the invention, the temperature has a lower limit of 80, 90, 100, 110, 120, 130, 140, 150, 160, 170, 180, 190, 200, 210, or 220° C. The temperature has an upper limit of 233, 220, 210, 200, 190, 180, 170, 160, 150, 140, 130, 120, 110, 100, or 90° C. For various embodiments of the invention the range of temperature may be any combination of the lower limit of temperature with any upper limit of temperature. The pressures utilized in the bonding or laminating of the thermoplastic article of the invention preferably are in the range of about 0.034 to 2.41 MPa (about 5 to 350 pounds per square inch gauge ("psig")). For certain embodiments of the invention, the pressure has a lower limit of 5, 10, 20, 30, 40, 50, 60, 70, 80, 90, 100, 110, 120, 130, 140, 150, 175, 200, 225, 250, 275, 300 or 325 psig.). For certain embodiments of the invention, the pressure has an upper limit of 10, 20, 30, 40, 50, 60, 70, 80, 90, 100, 110, 120, 130, 140, 150, 175, 200, 225, 250, 275, 300, 325 or 350 psig. For various embodiments of the invention the range of pressure may be any combination of the lower limit of pressure with any upper limit of pressure.

In certain embodiments according to the present invention, the temperature at the interface of the laminated sheets ranges from about 100 to about 160° C., or from about 110 to about 160° C., or from about 120 to about 160° C., or about 130 to about 160° C., or about 140 to about 160° C., or about 150 to about 160° C. In certain embodiments, the temperature at the laminated sheets ranges from about 40 to about 80° C. above the Tg of at least one of the sheets, or from about 50 to about 80° C. above the Tg of at least one of the sheets, or from about 60 to about 80° C. above the Tg of at least one of the sheets, or from about 70 to about 80° C. above the Tg of at least one of the sheets.

In certain embodiments, the temperature at the interface of the laminated sheets ranges from about 10° C. below the Tg of at least one of the laminated sheets to about 80° C. above the Tg of at least one of the laminated sheets. In certain embodiments, the temperature at the interface of the laminated sheets ranges from about 10° C. below the Tg of at least one of the laminated sheets to about 80° C. above the Tg of both of the laminated sheets.

In certain embodiments according to the present invention, the temperature at the interface of the laminated sheets is maintained at the desired setpoint for a time ranging from about 0.5 minutes to about 1.5 minutes, or 0.5 minutes to about 2.0 minutes, or 0.5 to about 3 minutes or, about 0.5 minutes to 4.0 minutes. In certain embodiments according to the present invention, the temperature at the interface of the laminated sheets is maintained at the desired setpoint for a time ranging from about 5 minutes to about 10 minutes, or 10 minutes to about 20 minutes, or 10 to about 30 minutes or, about 10 minutes to 40 minutes.

In other embodiments according to the present invention, the temperature at the interface of the laminated sheets is maintained at the desired setpoint for a time ranging from about 0.5 minutes to about 120 minutes, or 0.5 minutes to about 60 minutes, or 0.5 to about 45 minutes or, about 0.5 minutes to 30 minutes. In other embodiments according to the present invention, the temperature at the interface of the laminated sheets is maintained at the desired setpoint for a time ranging from about 1 minute to about 120 minutes, or 1 minute to about 60 minutes, or 1 minute to about 45 minutes or, about 1 minute to 30 minutes. In other embodiments according to the present invention, the temperature at the interface of the laminated sheets is maintained at the desired setpoint for a time ranging from about 5 minutes to about 120 minutes, or 5 minutes to about 60 minutes, or 5 minutes to about 45 minutes or, about 5 minutes to 30 minutes. In other embodiments according to the present invention, the temperature at the interface of the laminated sheets is maintained at the desired setpoint for a time ranging from about 10 minutes to about 120 minutes, or 10 minutes to about 60 minutes, or to about 45 minutes or, about 15 minutes to 30 minutes.

In certain embodiments according to the present invention, the pressure on the laminate sheets ranges from about 20 to about 400 psig, or about 40 to 400 psig, or about 50 psig to about 400 psig, or about 20 to about 150 psig, or about 40 to about 150 psig.

The temperature for bonding the thermoplastic articles will vary depending, for example, on the particular material or blend employed and the thickness of the sheet materials used, and may be determined by those skilled in the art using the disclosures herein. The pressure will vary depending on the pressure sensitivity of the electrical structure being encapsulated. LEC panels, in one example, are pressed at approximately 0.10 MPa (15 psi). The laminate is held at the appropriate temperature and pressure for about 5 to 45 minutes, or until such time as a bond is formed between the upper and lower sheet materials. After 5 to 45 minutes, the bonded/fused thermoplastic article is allowed to cool under pressures from about 0.034 to 2.41 MPa (about 5 to 350 psi), preferably about 0.10 MPa (15 psi), until it cools below the glass transition temperature of the sheet material. In certain embodiments according to the present invention, during the bonding process, the sheet material may be bonded or fused to the electrically energized device without the use of an adhesive.

The residence times of 5 to 45 minutes are generally applicable to single laminates layup configurations. Multiple laminate layups, stacked vertically and separated by release papers and caul plates, can also be constructed such that multiple laminates are produced in just one heated platen opening. The residence times for these multiple layup configurations may exceed 45 minutes. Proper residence times for multiple layup configurations may be determined by one of ordinary skill using the disclosures herein. The lower limit of residence time may be 5, 10, 15, 20, 25, 30, or 40 minutes. The upper limit of residence time may be 45, 40, 35, 30, 25, 20, 15, or 10 minutes. For various embodiments of the invention the range of residence times may be any combination of the lower limit of residence time with any upper limit of residence time.

The relatively low forces used in the thermocompressive lamination of these pressure-sensitive electrical structures may cause air entrapment. Typical air removal methods include lamination under a vacuum; pre-drying the raw materials; or creating channels for air escape, such as a matte texture on the sheet surface, matte textured release paper, or including a "glass sheen" fabric (available from Danzian) between areas prone to air entrapment. For thicker panels (about 10 mils or thicker), polymeric thin film shims can be added around the article to be encapsulated to further aid air removal.

For temperature-sensitive objects, additional insulating layers can be added to further protect the sensitive portions of the panel. The insulating layers may be an interior layer that becomes a part of the finished laminated panel or the insulating layers may be external layers that are removed when the laminated panel is removed from the lamination press.

In one aspect the invention relates to a thermoplastic article having an electrically energized device obtained by applying heat and pressure to a laminate comprising, (1) at least one electrically energized device comprising light emitting capacitors (LECs), light emitting diodes (LED's), printed "circuit boards" that emit light when energized, electrochromic layers, photovoltaics, transmitters, receivers, antennas, electromagnets, electrodes and smart sensors capable of detecting wind speed and direction, temperature, pressure, relative humidity, rainfall, motion, radiation, specific chemical species or combinations thereof and (2) at least one lower sheet and upper sheet material; wherein the upper or lower sheet materials are formed from a polyester.

In one aspect the invention relates to a thermoplastic article having an electrically energized device obtained by applying heat and pressure to a laminate comprising, (1) at least one electrically energized device comprising light emitting capacitors (LECs), light emitting diodes (LED's), printed "circuit boards" that emit light when energized, electrochromic layers, photovoltaics, transmitters, receivers, antennas, electromagnets, electrodes and smart sensors capable of detecting wind speed and direction, temperature, pressure, relative humidity, rainfall, motion, radiation, specific chemical species or combinations thereof; and (2) at least one lower sheet and upper sheet material; wherein the upper or lower sheet materials are formed from a polyester, polyacrylate, polycarbonate or a miscible polyester/polycarbonate blend, wherein the lamination process uses a perimeter frame, as described above, and the device having a surface area ranging from greater than about 1 square foot (0.93 square meters) and less than about 120 square feet (11.2 square meters) and wherein the polyester layers have a flow during encapsulation less than the flow that induces fractures in the electrically energized device.

In one aspect the invention relates to a thermoplastic article having an electrically energized device obtained by applying heat and pressure to a laminate comprising, (1) at least one electrically energized device comprising light emitting capacitors (LECs), light emitting diodes (LED's), printed "circuit boards" that emit light when energized, electrochromic layers, photovoltaics, transmitters, receivers, antennas, electromagnets, electrodes and smart sensors capable of detecting wind speed and direction, temperature, pressure, relative humidity, rainfall, motion, radiation, specific chemical species or combinations thereof; and (2) at least one lower sheet and upper sheet material; wherein the upper or lower sheet materials are formed from a polyester, polyacrylate, polycarbonate or a miscible polyester/polycarbonate blend, wherein the lamination process uses a perimeter frame, as described above, and the device having a surface area ranging from greater than about 1 square foot (0.93 square meters) and less than about 120 square feet (11.2 square meters) and wherein the polyester layers have a flow during encapsulation less than the flow that induces burn-through in the electrically energized device.

The present invention relates to thermoplastic articles containing or comprising a branching agent to reduce undesirable flow during the lamination processes and methods of making the laminated articles. The use of branching agents unexpectedly permits sufficient flow for the lamination processes described herein. Previously it was believed that the use of branching agents in lamination processes, as described herein, would have required temperatures, pressures and/or cycle times that would have been prohibitive for economic reasons or because of damage to the laminated articles or inclusions.

In certain embodiments according to the present invention, the reduction in flow of the first layer and the second layer of inventive articles, as measured by the change of area of the layers, decrease more than about 15% or about 25% or about 27% or about 30% or about 33% or about 35% or about 36% or about 40% or about 42% or about 50% or about 52% or about 55% or about 60% or about 65% or about 70% or about 75% or about 78% or about 80% or about 85% or about 90% or about 95% or about 100% or about 105% or about 108% relative to similar copolyester layers without the branching agent during the lamination. The reduction in flow is determined by measuring the area of the sheets prior to lamination and after lamination. The change in area for the sheets with the branching agent is subtracted from the area for the sheets without the branching agent and the difference is divided by the change in area for the sheets with the branching agent. Examples are shown in Table 1.

Reduction in flow (%)=[Change in area of sheet without branching agent−Change in area of sheet with branching agent]/Change in area of sheet with branching agent.

In one aspect the invention relates to branching agents comprising about 0.05 to about 0.75 wt %, or about 0.5 to about 0.50 wt %, or about 0.5 to about 0.25 wt % of the polyester layer, based on the total weight of the polyester layer.

In one embodiment of the invention suitable polyesters include copolyesters commercially available from Eastman Chemical Company as PETG Copolyester. These copolyesters comprise repeating units of diacid residues and diol residues. At least 80 mole percent of the diacid residues are terephthalic acid residues. The diacid component of the copolyesters optionally may comprise up to 20 mole percent of one or more other dicarboxylic acid such that the sum of the dicarboxylic acid units is equal to 100 mol percent. Examples of such other dicarboxylic acids include phthalic acid, isophthalic acid, 1,4-, 1,5-, 2,6- or 2,7-naphthalenedicarboxylic acid, 1,3- or 1,4-cyclohexanedicarboxylic acid (which may be cis, trans or a mixture thereof), cyclohexanediacetic acid, trans-4,4'-stilbenedicarboxylic acid, 4,4'-oxydibenzoic acid, 3,3'- and 4,4'-bi-phenyldicarboxylic acids and aliphatic dicarboxylic acids such as malonic, succinic, glutaric, adipic, pimelic, suberic, azelaic, sebacic, nonane, decane, and dodecanedicarboxylic acids. The "residue" of the dicarboxylic acids described herein is that portion of the diacid which constitutes a portion of a diester of the diacid. The diacid residues may be derived from the dicarboxylic acid, dialkyl esters thereof, e.g., dimethyl terephthalate and bis(2-hydroxyethyl) terephthalate, acid chlorides thereof and, in some cases, anhydrides thereof.

In one embodiment of the present invention, the diol component of the copolyesters comprises from 98 to 1 mole percent ethylene glycol residues and 2 to 99 mol percent 1,3-cyclohexanedimethanol and/or 1,4-cyclohexanedimethanol. Up to 20 mole percent of the diol component may be made up of the residues of one or more diols other than ethylene glycol and cyclohexanedimethanol such that the sum of all diol residues is 100 mole percent. Examples of such additional diols include cycloaliphatic diols having 3 to 16 carbon atoms and aliphatic diols having 3 to 12 carbon atoms. Specific examples of such other diols include, but are not limited to, 1,2-propanediol, 1,3-propanediol, neopentyl glycol, 2-methyl-1,3-propanediol, 1,4-butanediol, 1,5-pentanediol, 1,6-hexanediol, 2,2,4,4-tetramethyl-1,3-cyclobutanediol (trans-, cis- or mixtures thereof), and p-xylylene glycol. The copolyesters also may be modified with minor amounts of polyethylene glycols or polytetramethylene glycols to enhance elastomeric behavior, e.g., polyethylene glycols and polytetramethylene glycols having weight average molecular weights in the range of about 500 to 2000. In one embodiment of the present invention, the diol component of the copolyesters consists essentially of residues of ethylene glycol and 1,4-cyclohexanedimethanol wherein the mole ratio of ethylene glycol residues:1,4-cyclohexanedimethanol residues is about 10:90 to about 90:10, or preferably about 60:40 to about 80:20 or 38:62 to about 88:12.

In one embodiment of the invention, the diol portion of the polyester comprises ethylene glycol and 1,4- or 1,3-cyclohexanedimethanol (cis-, trans-, and mixtures thereof). In another embodiment of the invention, the diol portion of the polyester consists essentially of ethylene glycol and 1,4- or 1,3-cyclohexanedimethanol (cis-, trans-, and mixtures thereof). In one embodiment of the invention, the diol portion of the polyester comprises neopentyl glycol and 1,4- or 1,3-cyclohexanedimethanol (cis-, trans-, and mixtures thereof). In another embodiment of the invention, the diol portion of the polyester consists essentially of neopentyl glycol and 1,4- or 1,3-cyclohexanedimethanol (cis-, trans-, and mixtures thereof). In one embodiment of the invention, the diol portion of the polyester comprises ethylene glycol and 2-methyl-1,3-propanediol. In another embodiment of the invention, the diol portion of the polyester consists essentially of ethylene glycol and 2-methyl-1,3-propandediol. In one embodiment of the invention, the diol portion of the polyester comprises ethylene glycol and neopentyl glycol. In another embodiment of the invention, the diol portion of the polyester consists essentially of ethylene glycol and neopentyl glycol. In another embodiment of the invention, the diol portion of the polyester comprises 1,3- and 1,4-cyclohexanedimenthanol (cis-, trans-, and mixtures thereof) and 2-methyl-1,3-propandediol. In another embodiment of the invention, the diol portion of the polyester consists essentially of 1,3- and 1,4-cyclohexanedimenthanol (cis-, trans-, and mixtures thereof) and 2-methyl-1,3-propandediol. In another embodiment of the invention, the diol portion of the polyester comprises neopentyl glycol and 2-methyl-1,3-propandediol. In another embodiment of the invention, the diol portion of the polyester consists essentially of neopentyl glycol and 2-methyl-1,3-propandediol.

Polycarbonates useful in this invention comprise the divalent residue of dihydric phenols bonded through a carbonate linkage and are represented by structural formulae I and II.

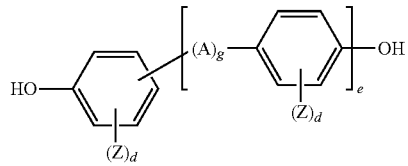

Formula I

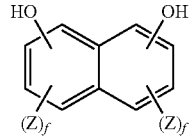

Formula II wherein:
A denotes an alkylene group with 1 to 8 carbon atoms; an alkylidene group with 2 to 8 carbon atoms; a cycloalkylene group with 5 to 15 carbon atoms; a cycloalkylidene group with 5 to 15 carbon atoms; a carbonyl group; an oxygen atom; a sulfur atom; —SO— or —$SO_2$—; or a radical conforming to e and g both denote the number 0 to 1; Z denotes F, Cl, Br or C1-4.alkyl; and if several Z radicals are substituents in one aryl radical, they may be identical or different from one another; d denotes an integer of from 0 to 4; and f denotes an integer of from 0 to 3.

By the term "alkylene" is meant a bivalent saturated aliphatic radical wherein the two valences are on different carbon atoms, e.g., ethylene; 1,3-propylene; 1,2-propylene; 1,4-butylene; 1,3-butylene; 1,2-butylene, amylene, isoamylene, etc. By the term "alkylidene" is meant a bivalent radical wherein the two valences are on the same carbon atoms, e.g., ethylidene, propylidene, isopropylidine, butylidene, isobutylidene, amylidene, isoamylidene, 3,5,5,-trimethylhexylidene. Examples of "cycloalkylene" are cyclopropylene, cyclobutylene, and cyclohexylene. Examples of "cycloalkylidene" are cyclopropylidene, cyclobutylidene, and cyclohexylidene. Examples of C1-4 alkyl are methyl, ethyl, propyl, isopropyl, butyl, and isobutyl.

Typical of some of the dihydric phenols employed are bis-phenols such as 2,2-bis-(4-hydroxyphenyl)-propane (bisphenol A), 3,3,5-trimethyl-1,1-bis(4-hydroxyphenyl)-cyclohexane, 2,4-bis-(4-hydroxyphenyl)-2-methyl-butane, 1,1-bis-(4-hydroxyphenyl)-cyclohexane, alpha,alpha'-bis-(4-hydroxyphenyl)-p-diisopropylbenzene, 2,2-bis-(3-methyl-4-hydroxyphenyl)-propane, 2,2-bis-(3-chloro-4-hydroxyphenyl)propane, bis-(3,5-dimethyl-4-hydroxyphenyl)-methane, 2,2-bis-(3,5-dimethyl-4-hydroxyphenyl)-propane, bis-(3,5-dimethyl-4-hydroxyphenyl)-sulfide, bis-(3,5-dimethyl-4-hydroxyphenyl)-sulfoxide, bis-(3,5-dimethyl-4-hydroxyphenyl)-sulfone, dihydroxy-benzophenone, 2,4-bis-(3,5-dimethyl-4-hydroxyphenyl)-cyclohexane, alpha,alpha'-bis-(3,5-dimethyl-4-hydroxyphenyl)-p-diisopropylbenzene and 4,4'-sulfonyl diphenol. Other dihydric phenols might include hydroquinone, resorcinol, bis-(hydroxyphenyl)-alkanes, bis-(hydroxyphenyl)ethers, bis-(hydroxyphenyl)-ketones, bis-(hydroxyphenyl)-sulfoxides, bis-(hydroxyphenyl)-sulfides, bis-(hydroxyphenyl)-sulfones, and alpha,alpha-bis-(hydroxyphenyl)diisopropylbenzenes, as well as their nuclear-alkylated compounds. These and further suitable dihydric phenols are described, for example, in U.S. Pat. Nos. 2,991,273; 2,999,835; 2,999,846; 3,028,365; 3,148,172; 3,153,008; 3,271,367; 4,982,014; 5,010,162 all incorporated herein by reference. The polycarbonates of the invention may entail in their structure, units derived from one or more of the suitable bisphenols. The most preferred dihydric phenol is 2,2-bis-(4-hydroxyphenyl)-propane (bisphenol A).

The carbonate precursors are typically a carbonyl halide, a diarylcarbonate, or a bishaloformate. The carbonyl halides include, for example, carbonyl bromide, carbonyl chloride, and mixtures thereof. The bishaloformates include the bishaloformates of dihydric phenols such as bischloroformates of 2,2-bis(4-hydroxyphenyl)-propane, hydroquinone, and the like, or bishaloformates of glycol, and the like. While all of the above carbonate precursors are useful, carbonyl chloride, also known as phosgene, and diphenyl carbonate is preferred.

The aromatic polycarbonates can be manufactured by any processes such as by reacting a dihydric phenol with a carbonate precursor, such as phosgene, a haloformate or carbonate ester in melt or solution. Suitable processes are disclosed in U.S. Pat. Nos. 2,991,273; 2,999,846; 3,028,365; 3,153,008; 4,123,436; all of which are incorporated herein by reference.

In certain embodiments of the present invention, the polycarbonates have a weight average molecular weight, as determined by gel permeation chromatography, of about 10,000 to 200,000, preferably 15,000 to 80,000 and their melt flow index, per ASTM D-1238 at 300° C. is about 1 to 65 g/10 min, preferably about 2 to 30 g/10 min. The polycarbonates may be branched or unbranched. It is contemplated that the polycarbonate may have various known end groups. These resins are known and are readily available in commerce.

One or more branching agents may also be used in making the polycarbonates of the invention. Branching agents, such as tri- and tetrafunctional phenols and carbonic acids, as well as bisphenols with carbonic acid side chains are typically used. An example might include 1,4bis(4',4"-dihydroxytriphenylmethyl)benzene, and trisphenol TC. Nitrogen-containing branching agents are also used. Examples might include: cyanic chlorid and 3,3-bis(4-hydroxyphenyl)-2-oxo-2,3-dihydroindole.

Polyacrylates suitable in the context of the present invention are polyacrylate ester polymers having repeating unit of the Formula III:

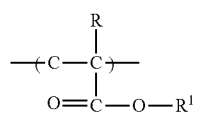

Formula III wherein R is either hydrogen, methyl or carboxyl groups and blends thereof and wherein R1 includes hydrogen, methyl, ethyl and other alkyl or cycloalkyl functional groups having 3 to 20 carbon atoms, aminyl, hydroxyl, N-hydroxymethyl, epoxyl and dialkenyl functional groups or blends thereof. Examples of the R1 portion are hydrogen, methyl, ethyl, propyl, isopropyl, isopropyl, n-butyl, sec-butyl, isobutyl, tert-butyl, hexyl, heptyl, 2-heptyl, 2-ethylhexyl, 2-ethylbutyl, dodecyl, hexadecyl, isobornyl, cyclohexyl, t-butylaminoethyl, dimethylaminoethyl, 2-hydroxyethyl, 2-ethoxyethyl, N-hydroxymethyl, glycidyl or 1,4-butylene dimethacryl functional groups.

Polyester/polycarbonate miscible blends suitable in the context certain embodiments of the present invention comprise:
(a) 1 to 99 weight % of a polyester, comprising a diacid residue component selected from the group consisting of aliphatic, alicyclic, and/or aromatic dicarboxylic acids, wherein the aromatic portion of said aromatic dicarboxylic acid has 6-20 carbon atoms, wherein the aliphatic or alicyclic portion of said aliphatic or alicyclic dicarboxylic acid has 3-20 carbon atoms, and a glycol residue component comprising from 45 mole % to 100 mole % 1,4-cyclohexanedimethanol, and, optionally, at least one additional aliphatic glycol having 2-20 carbon atoms; wherein the total mole percentages for the glycol component equals 100 mole %.
(b) 99 to 1 weight % of a polycarbonate;
wherein the total combined weight percentage of polyester and polycarbonate in the polyester/polycarbonate blend equals 100 weight %. Suitable polyester/polycarbonate blends are exemplified in U.S. Pat. No. 6,896,966.

In one embodiment the polyester/polycarbonate blend composition suitable in the present invention comprises 50-90 weight % by weight of the polyester and 50-10 weight % by weight of the polycarbonate. In another embodiment, the blend composition comprises 60-80 weight % polyester and 40-20 weight % by weight polycarbonate.

Polyesters particularly suitable in certain embodiments having polyester/polycarbonate blends of the present invention are polyesters having repeating unit of the Formula IV:

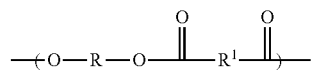

Formula IV wherein R is the residue of 1,4 cyclohexanedimethanol or a mixture of 1,4 cyclohexanedimethanol and at least one aryl, alkane or cycloalkane containing diol having 2 to 20 carbon atoms; and wherein R1 is the decarboxylated residue derived from an aryl, aliphatic, or cycloalkane containing diacid of 3 to 20 carbon atoms. Examples of the diol portion, R, are ethylene glycol, 1,2-propylene glycol, 1,3-propanediol, 1,4-butanediol, 1,5-pentanediol, 1,6-hexanediol, 1,2- or 1,3-cyclohexanedimethanol, neopentyl glycol, and 2,2,4,4 tetramethyl-1,3-cyclobutanediol. In one embodiment the second glycol comprises ethylene glycol, and mixtures thereof. Examples of the diacid portion, R1, are malonic, succinic, glutaric, adipic, pimelic, suberic, azelaic, sebacic, dodecanedioic, 1,4-, 1,5-, and 2,6-decahydronaphthalenedicarboxylic acid, and cis- or trans-1,4-cyclohexanedicarboxylic acid. Examples of useful aromatic dicarboxylic acids are terephthalic acid, isophthalic acid, 4,4'-biphenyldicarboxylic, trans 3,3'- and trans 4,4 stilbenedicarboxylic acid, 4,4'-dibenzyldicarboxylic acid, 1,4-, 1,5'-, 2,3-, 2,6, and 2,7-naphthalenedicarboxylic acid. Chemical equivalents of these diacids, and within the scope of the present invention, include esters, alkyl esters, dialkyl esters, diaryl esters, anhydrides, salts, acid chlorides, acid bromides, and the like and are included within the scope of this invention. In certain embodiments of the present invention, the preferred dicarboxylic acids are terephthalic and isophthalic acid or mixtures thereof. In certain embodiments, the preferred chemical equivalent comprises dialkyl esters of terephthalic and isophthalic acid. Mixtures of any of these acids or equivalents may be used.

In certain embodiments, polyesters useful within the scope of this invention comprise a polyester having from 40 to 100 mole %, more preferably 60 to 80 mole % of 1,4-cyclohexanedimethanol wherein the total mole percentages of the glycol component in the polyester equal 100 mole %. The remainder of the glycol component comprises any of the other glycols described herein but, in certain embodiments, preferably ethylene glycol in the amount of 0 to 60 mole %, more preferably, 20 to 40 mole %. Although any diacid as described herein may be used, 80 to 100 mole % terephthalic acid is preferred for certain embodiment.

In another embodiment of polyester/polycarbonate miscible blends, the polyester useful within the scope of this invention is a polyester having from 100 mole % 1,4-cyclohexanedimethanol wherein the total mole percentages of the glycol component in the polyester equal 100 mole %. Also, in this particular embodiment, it is preferred that isophthalic acid is present in the amount of 5 to 50 mole %, more preferably, 20 to 40 mole %. Although any diacid as described herein may be used, it is preferred in certain embodiments that terephthalic acid is present in the amount of 95 to 50 mole %.

Conventional polycondensation processes, well known in the art, are used to prepare the polyesters useful in the present invention. These include direct condensation of the acid(s) with the diol(s) or by ester interchange using lower alkyl esters. In one aspect, the inherent viscosity of the polyesters of the present invention may range from about 0.5 to about 1.2 dL/g, about 0.4 to about 1.0 dl/g or about 0.6 to about 0.9 dL/g at 25° C., measured by dissolving about 0.50 g of the polyester in about 100 mL of a solvent consisting of 60% by weight phenol and 40% by weight tetrachloroethane.

The polymerization reaction to form the polyesters useful in the present invention may be carried out in the presence of one or more conventional polymerization catalysts. Typical catalysts or catalyst systems for polyester condensation are well known in the art. Suitable catalysts are disclosed, for example, in U.S. Pat. Nos. 4,025,492, 4,136,089, 4,176,224, 4,238,593, and 4,208,527, the disclosures of which are herein incorporated by reference. Further, R. E. Wilfong, Journal of Polymer Science, 54, 385, (1961) describes typical catalysts, which are useful in polyester condensation reactions. Preferred catalyst systems include Ti, Ti/P, Mn/Ti/Co/P, Mn/Ti/P, Zn/Ti/Co/P, Zn/Al, and Li/Al. When cobalt is not used in the polycondensation, copolymerizable toners may be incorporated into the copolyesters to control the color of these copolyesters so that they are suitable for applications in which color may be an important property. In addition to the catalysts and toners, other conventional additives, such as antioxidants, dyes, etc., may be used in the copolyesterifications in typical amounts.

In certain embodiments, one or more branching agents may also be useful in making the polyesters useful in the present invention. The branching agent can be one which provides branching in the acid unit portion of the polyester, or in the glycol unit portion, or it can be a hybrid. Illustrative of such branching agents are polyfunctional acids, polyfunctional glycols and acid/glycol hybrids. Examples include, but are not limited to, tri or tetracarboxylic acids, such as trimesic acid, pyromellitic acid and lower alkyl esters thereof and the like, and tetrols such as pentaerythritol. Also triols such as trimethylolpropane or dihydroxy carboxylic acids and hydroxydicarboxylic acids and derivatives, such as dimethyl hydroxy terephthalate, and the like are useful within the context of this invention. Trimellitic anhydride is a preferred branching agent. The branching agents may be used either to branch the polyester itself or to branch the polyester/polycarbonate blend of the invention.

Polymer miscibility is defined herein as a polymer blend or mixture forming a single phase.

Miscible polymer blends useful in this invention were first disclosed in Research Disclosure 22921, May, 1983, which concerns blends of polycarbonate with polyesters based on terephthalic acid and a mixture of 1,4-cyclohexanedimethanol and ethylene glycol. Similar miscible blends are disclosed in U.S. Pat. Nos. 4,786,692 and 5,478,896. Blends of polycarbonate with another family of polyesters, those based on a mixture of terephthalic and isophthalic acids with 1,4-cyclohexanedimethanol, are disclosed in U.S. Pat. Nos. 4,188,314 and 4,391,954. British Patent Specification 1,599,230 (published Jan. 16, 1980) discloses blends of polycarbonate with polyesters of 1,4-cyclohexanedimethanol and a hexacarbocyclic dicarboxylic acid. Mohn et al. reported on thermal properties of blends of polyesters based on 1,4-cyclohexanedimethanol and terephthalic acid or terephthalic/isophthalic acid mixtures with polycarbonate [J. Appl. Polym. Sci., 23, 575 (1979)].

One embodiment of the invention is the laminate of the invention consisting of an electrically energized layer (1) and upper or lower sheet material (2), it is also within the scope of this invention that there can be multiples of such laminates within the same thermoplastic article, i.e., electrically energized layer, upper or lower sheet material, electrically energized layer, upper or lower sheet material, etc.

The polyesters useful in certain embodiments of this invention maybe made by conventional melt processing techniques. For example, pellets of the polyester may be mixed with pellets of the polycarbonate and subsequently melt blended on either a single or twin screw extruder to form a homogenous mixture.

The polyesters, polyacrylates, polycarbonates or polyester/polycarbonate blends useful in various embodiments of the invention may contain impact modifiers, UV stabilizers, stabilizers, nucleating agents, extenders, flame retarding agents, reinforcing agents, fillers, antistatic agents, antimicrobial agents, antifungal agents, self-cleaning or low surface energy agents, mold release agents, scents, colorants, antioxidants, extrusion aids, slip agents, release agents, light diffusing additives, carbon black, and other pigments, and the like all and mixtures thereof which are known in the art for their utility in polyesters, polyacrylates, polycarbonates or polyester/polycarbonate blends. In particular, the use of phosphorous based stabilizers for further color reductions, if needed, is well known in the art.

The upper and lower sheet materials used in the manufacture of the thermoplastic articles of the present invention may be the same or different. For example, the upper and lower sheet materials may be produced from different polyesters, polyacrylates, polycarbonates or polyester/polycarbonate miscible blends (as defined herein) or compositions that contain different additives, e.g., pigment additives that alter the transparency of the sheeting.

The sheet material used in the preparation of the thermoplastic articles of the present invention may be transparent, translucent, or one layer may be opaque, depending on the particular aesthetic effect desired. The upper and lower sheet materials may differ in degree of transparency or translucency and also in color. When the upper and lower sheet materials are produced from chemically dissimilar materials, the dissimilar materials must be thermally compatible. As used herein, the term "thermal compatibility" means that when layers of the sheet materials are bonded together under conditions of elevated temperature and pressure, the layers undergo approximately equal thermal expansion or contraction such that the solid surface is substantially planar.

Some electrical components may have a sensitivity to moisture when exposed to outdoor environments. In addition to pre-drying the raw materials, the encapsulation of additional moisture barriers, such as a layer of EVOH or nanoclay-impregnated metaxylene diamine ("MXD6"), may be required beyond the copolyester, et al, sheeting already present. These barrier layers can be added to the laminate layup as either a film or co-extruded directly onto the plastic sheeting. Desiccants or other hydrophilic moisture scavengers can also be encapsulated with the panels.

The composition and blends thereof constituting the sheet materials used in the manufacture of the articles and sheeting of the present invention may not be as hard or scratch resistant as may be necessary or desired for certain end uses. For example, an end use in which the exterior surface of the thermoplastic article may be subjected to scratching or abrasion, i.e., in a wall decoration, may require the application of an abrasion-resistant coating to the exterior surface. For example, films consisting of fluorinated hydrocarbons, poly(perfluoroethylene) such as TEDLAR from duPont Chemical Company or oriented poly(ethylene terephthalate) such as MYLAR from duPont Chemical Company may be used to improve both chemical and abrasion resistance. The abrasion resistant film typically has a thickness in the range of about 0.025 to 0.254 mm (0.001-0.01 inch), preferably about 0.051 to 0.178 mm (0.002-0.007 inch), and most preferably about 0.076 mm (0.003 inch). However, abrasion resistant film thinner or thicker than these ranges may be used since the thickness of such film is limited only by the equipment available cost and functionality considerations. An adhesive optionally may be used between the thermoplastic sheet and the abrasion resistant film.

Alternatively, an abrasion resistant coating may be applied to a plastic film and then the film bearing the abrasion resistant coating may be laminated to one or both sides of the article of the present invention. The film may be selected from a number of thermoplastic materials compatible with the lamination process such as poly(vinyl chloride), PETG copolyester, poly(ethylene terephthalate), poly(methyl methacrylate), polycarbonate, miscible polyester/polycarbonate blends, and the like.

The film thickness may range from 0.0025-0.381 mm (0.001-0.015 inch) with a thickness of 0.0762-0.203 mm (0.003-0.008) being most preferred. The coating may be selected from a number of commercially-available materials such as polyurethanes, fluorinated polyurethanes and silicones which are cured by heat or they may be selected from materials that are cured by ultraviolet (UV) or electron beam (EB) radiation. Such UV/EB cured materials fall under the general class of acrylates and modified acrylates that contain fluorine, silicone, epoxy, polyester, polyether or caprolactone residues or functional groups. The particular coating material selected will depend primarily on the degree of abrasion resistance required. Application of the liquid, heat- or UV/EB-curable precursor of the abrasion resistant coating may be carried out according to conventional procedures and usually is accomplished on a roll coating machine. The thickness of the coating applied to a film generally is 0.0076-0.051 mm (0.0003-0.002 inch) with thickness of about 0.0127 mm (0.0005 inch) being most preferred. Primers or tie layers can also be used between the hardcoat and film layer to promote adhesion.

These coatings may be applied in a manner similar to the application of paints. The coatings exist either as predominantly undiluted material with very little volatile content or as solvent- or water-based materials. In addition to being applied to a film that can be laminated to the structure as part of the process, they may be applied directly to the finished product. Application may be carried out by a variety of techniques such as roll, paint, spray, mist, dip and the like.

The thermoplastic article or laminate, based on polyesters, polyacrylates, polycarbonates or polyester/polycarbonate miscible blends, can be subsequently shaped and thermoformed into a variety of useful products. As an illustrative example, the thermoplastic article can be thermoformed or otherwise shaped into curved signage, backlit instrument panels, cellular phone panels, computer keyboards, safety vests, flooring, shower doors, privacy partitions, and tabletops and other furniture pieces. Depending on the nature of the electrically energized device, the thermoplastic articles of this invention may be formed, heat draped, or molded. In addition, the articles of the present invention have an appealing appearance with low density to facilitate transport and installation of building materials produced there from.

In addition to the batch lamination method discussed herein, continuous lamination techniques can also be employed. For example, since LEC panels are flexible, they can be fed through the roll stack on a sheet extrusion line to form an in-line lamination process. The typical injection path is usually between the second and third polished (or otherwise textured) rolls that the polymer touches. This would involve the middle and top cooling rolls for upright roll stacks with an upward product flow. To achieve proper lamination, the LEC panels will need to be fed "face down" where the illuminated side touches the plastic sheet being made. Proper adhesion temperatures are between 175 to 425° F., preferably between 180 and 300° F., controlled by the cooling rolls which should operate with a low side-to-side temperature differential of less than 20° F., preferably less than 5° F. In cases where true encapsulation is needed, multiple materials can be fed into the roll stack. For example, pre-heated plastic sheeting could be fed through the roll stack on a sheet extrusion line along with the LEC panel such that the LEC panel is entirely encapsulated.

Other continuous processes can also be envisioned, such as continuously unwinding two rolls of plastic sheeting with the LEC panels being fed between the two sheets. An oven or other heating device would be needed to heat the plastic to the same temperatures mentioned during the batch lamination process to achieve proper adhesion. A set of pressurized nip rollers or similar pressure application devices could then be used to achieve proper adhesion. From an air removal standpoint, an in-line vacuum chamber or the use of glass sheen and similar fabrics could be also be used, similar to methods discussed for the batch lamination process. This type of continuous process could also be devised where the lamination is caused by means other than external heat. For example, solvent bonding (entire sheet or just the edges) or edge sealing (via frictional methods, targeted melting via laser or other devices) are also possible.

To further optimize the process, the indium tin oxide (ITO) or similar functional LEC layers could be applied directly to the plastic sheet in either method previously discussed—in-line lamination with a sheet extrusion line or the dual roll unwinding processes. This process could simplify the overall structure by reducing the total number of required layers in the LEC panel.

The method in Example 1 demonstrates a method to properly encapsulate an electrically energized device in a panel using a heated laminated press. Similar conditions be could obtained without a heated laminating press by using a vacuum bagging operation and an oven. The alternate method applies a low "pressure," which is the pressure differential between atmospheric pressure plus the weight of panel in multiple lamination stacks and a vacuum on the inside of the bag. This entire vacuum bagged layup is then put into an "autoclave" oven.

EXAMPLES

Example 1

The layup was constructed according to the following layered arrangement on each side of the LEC panel: 60 mil rubber silicone pad for pressure distribution, 30 mil polished metal plate, "Ultracast patent" release paper, "Stratafilm" hardcoat film (~5 mil thick), 118 mil Spectar™ copolyester plastic sheeting (with matte surface toward the LEC panel to prevent air entrapment, with the surface roughness or "Ra" value of 110 micro inches), 17 mil CeeLite™ light emitting capacitor (LEC) panel. The panel was framed with 15 mil Spectar film around its perimeter to avoid air entrapment in this region. The layup was transferred to a heated press with a top and bottom plate temperature set point of 120° C. A metal transfer plate was also used beneath the layup to help properly position the structure in the press. The press was closed around the structure using a setting of roughly 5,000 foot-pounds (which is slightly above contact pressure due to the weight of the platens being raised). After approximately six minutes (when the interfacial sheet temperature reaches about 230° F.), the heat to the plates was turned off and the cooling water turned on. When the interfacial sheet temperature reached 130° F., the layup was removed from the press for inspection. The combined effect of directionally lower pressures, short time and normal heat (normal for copolyester to copolyester lamination) created a quality lamination that didn't harm the encapsulated light panel, evidenced by the lack of pinpoint burn-through that would otherwise appear upon energization and by the lack of panel fracture lines caused by excessive copolyester sheet, and therefore LEC panel, flow or deformation. In other embodiments of the present invention, other methods could achieve the same or similar conditions instead of using heated platens, for example, the layups could be rolled into a convection oven to achieve a similar effect.

Example 2

Follow Example 1, but with the layup under vacuum. The layup was placed on an oversized flat metal transfer plate. The outermost perimeter edge of the oversized transfer plate was framed with ½ inch wide vacuum sealant tape available from General Sealants. A thin plastic film of Eastman's calendered GS5 was placed over the entire layup and pressed into the sticky sealant tape, totally sealing the structure. Pressure was reduced by puncturing the film with a syringe attached to a vacuum source and evacuating the sealed structure. A small square of vacuum sealant tape was placed around the syringe to eliminate leakage around the puncture. The vacuum was turned and left "on" during the heating and cooling steps mentioned in Example 1.

Example 3

Conditions which prevent excessive copolyester sheet (and therefore LEC panel) flow or deformation will make the desired lamination without defects that become apparent upon energization, for example, burn-through. Lamination parameters can be thought of in terms of a 3-dimensional operating surface with axes of temperature, pressure and time. The maximum operating surface for a LEC panel is below that for copolyester to copolyester lamination of non-temperature and/or non-pressure sensitive items or devices. To illustrate, getting a half inch of expansion on the sides of the polymer sheet during lamination is an indication that diffusive polymer chain entanglements have occurred at the sheet to sheet interface (a 12"×12" sheeting deforms to 12.5"×12.5" laminate, which is then trimmed to size). This situation is perfectly acceptable for lamination of relatively non-fragile items or devices, but not with LEC panels as fracture lines and pinpoint defects will develop, as previously explained. The lowering of either temperature, pressure or time (singly or in combination) to make a laminate without flow is one acceptable method to encapsulate LEC panels. In example 1, the pressure was lowered and time reduced to reduce flow and sheet deformation. According to the maximum operating surface concept, temperature can be lowered at normal pressure and longer cycle times to achieve the same effect. A specific example follows:

The layup was constructed according to the following layered arrangement: 60 mil rubber silicone pad for pressure distribution, 30 mil polished metal plate, "Ultracast patent" release paper, "Stratafilm" hardcoat film (~5 mil thick), 118 mil Spectar copolyester plastic sheeting (with matte surface to prevent air entrapment), 17 mil CeeLite light emitting capacitor (LEC) panel, 15 mil Spectar shim film around the CeeLite perimeter and continue the reverse of above, from the plastic sheeting to rubber pad, to complete the layup. The layup was transferred to a heated press with a top and bottom plate temperature setpoint of 100° C. A metal transfer plate was used beneath the layup as needed to help properly position the structure in the press. The press was closed around the layup using a setting of roughly 20,000 foot-pounds of pressure (about 140 psi for a 12"×12" structure). After approximately 30 minutes, the heat to the plates was turned off and cooling water turned on. When the interfacial sheet temperature reached 130° F., the layup was removed from the press for inspection. The combined effect of inventive selection of lower temperature, longer time and normal pressure (normal for copolyester to copolyester lamination) created a quality lamination that didn't harm the encapsulated light panel, evidenced by the lack of pinpoint burn-through that would otherwise appear upon energization and by the lack of panel fracture lines caused by excessive copolyester sheet, and therefore LEC panel, flow or deformation.

Note that lamination conceptionally occurs in a 3-dimensional operating volume defined by pressure, temperature and time. Without wishing to be bound by any theory applicants believe that as the upper/maximum operating surface is approached, a stronger lamination is made because of higher polymer chain mobility leads to more chain entanglements and therefore a stronger lamination. The goal is to maximize chain entanglements while preventing excessive material flow or deformation.

Example 4

Example 3 was repeated except the platen temperature was at 105° C., each Spectar sheet was 60 mils thick, the CeeLite panel was only 9 mils thick (the shielding on the back side had been removed), and the film shims used around the panel were 10 mils thick. The pressure was set at 90 psi with a time of 20 minutes in the heating cycle before cooling. This produced a "perfect" panel without fracture lines or pinpoint burn-through.

Example 5

Prophetic

Follow Example 1 except add a 5 mil thick film of EMAC, EVA, EVOH, PUR or the like, around the LEC panel to reduce the lamination temperature requirements and/or increase moisture diffusion barrier properties to the encapsulated LEC panel.

Example 6

Example 1 was followed except a 30 mil thick metal "frame" was included, one inch wide on all sides (center cut out), between the polished metal plate and the Ultracast release paper on the non-illuminated side (back side) of the LEC panel. This insert transferred the pressure to the lamination perimeter and aided bubble removal and lowered the pressure to the electrical component, thus preventing pinpoint burn-through defects. The LEC panel, prior to lamination, did not have any fracture lines or pinpoint burn-throughs, so it was fully operational. However, since the 30 mil frame was thick relative to the 17 mil LEC panel, a pocket or cavity of about 12 mils was formed. The presence of a pocket allowed to panel to wrinkle in the pocket, forming a fully functioning yet wrinkled, aesthetically unpleasant encapsulated LEC panel. Further experimentation with a thinner frame caused a thinner pocket prevented panel wrinkling. Other experimentation involved building up film layers behind the panel to fill the gap in the cavity. Additionally, the LEC panel was adhered to the polymer encapsulation sheet with a pressure-sensitive adhesive. Even though a pocket was formed behind the panel, the laminated LEC panel was unwrinkled and aesthetically pleasing because the air was directed behind the panel instead of on the illuminated side. Further, a clear polyethylene and then liquid oil film (in two different sets of experiments) were placed on the illuminated side of the LEC panel to ensure that no lamination occurred in these areas.

Applicants believe that either changing the materials of construction to prevent wrinkling, or making one layer of the LEC panel wider than the others to be encapsulated in the metal framed area (acting as anchor points) are expected to keep wrinkling or distortion to an acceptable, and possible, a minimum level. In summary, when the "pocket" method is used, the LEC panel may be fully functional yet have unpleasant aesthetic effects that will be mitigated by any of the methods described in this example.

Example 7

Prophetic

Follow Example 1 except replace the light emitting panel (which typically emits light over its entire surface area) with a similar panel that has been altered such that only portions of the panel emit light. For example, if the phosphor component has been applied to or in the shape of fossil leaves, then just this shape will fluoresce.

Example 8

Prophetic

The structure from Example 1 can be thermoformed or drape formed into various shapes during lamination, before cooling or if reheated to roughly 220-300° F. Higher temperatures may cause flow of the sheet material and thus deactivate the LEC panel. One should start at the lower temperatures and can increase temperature incrementally to decrease pressure and/or lamination times.

Example 9

The layup was constructed with 118 mil Spectar copolyester plastic sheeting, CeeLite LEC panel and 118 mil Spectar copolyester plastic sheeting. A hand-held mini-extruder with copolyester welding rod was used to seal the four edges around the perimeter. Spacers (60 mil×0.5"×12" Spectar) were added between the two sheets to create a gap to be filled by the welding rod. The edges were then cut and planed for aesthetic purposes.

SPECTAR™ is an amorphous copolyester containing 1,4-cyclohexanedimethanol as a comonomer.

PROVISTA™ is an amorphous copolyester containing 1,4-cyclohexanedimethanol as a comonomer and timellitic anhydride as a branching agent.

Example 10

Spectar and Provista were individually laminated at 120° C., 7000 lbs of ram force, for a time of 30 seconds heating after reaching a temperature within 10° C. of the setpoint. For Spectar, the initial area was 144.3 square inches and increased to a final area of 147.0 square inches resulting in an area increase of 2.7 square inches. For Provista, the initial area was 144.4 square inches and increased to a final area 146.5 square inches resulting in an area increase of 2.1 square inches.

Example 11

Spectar and Provista were individually laminated at 120° C., 21000 lbs of ram force, for a time of 30 seconds heating after reaching a temperature within 10 C. of the setpoint. For Spectar, the initial area was 137.6 square inches and increased to a final area of 142.9 square inches resulting in an area increase of 5.3 square inches. For Provista, the initial area was 144.5 square inches and increased to a final area 148.4 square inches resulting in an area increase of 3.9 square inches.

Example 12

Spectar and Provista were individually laminated at 120° C., 7000 lbs of ram force, for a time of 90 seconds heating after reaching a temperature within 10° C. of the setpoint. For Spectar, the initial area was 144.2 square inches and increased to a final area of 147.0 square inches resulting in an area increase of 2.8 square inches. For Provista, the initial area was 144.1 square inches and increased to a final area 146.7 square inches resulting in an area increase of 2.6 square inches.

Example 13

Spectar and Provista were individually laminated at 120° C., 21000 lbs of ram force, for a time of 90 seconds heating after reaching a temperature within 10° C. of the setpoint. For Spectar, the initial area was 144.3 square inches and increased to a final area of 150.3 square inches resulting in an area increase of 6.0 square inches. For Provista, the initial area was 143.2 square inches and increased to a final area 147.7 square inches resulting in an area increase of 4.5 square inches.

Example 14

Spectar and Provista were individually laminated at 140° C., 7000 lbs of ram force, for a time of 30 seconds heating after reaching a temperature within 10° C. of the setpoint. For Spectar, the initial area was 144.4 square inches and increased to a final area of 160.8 square inches resulting in an area increase of 16.4 square inches. For Provista, the initial area was 143.1 square inches and increased to a final area 151.1 square inches resulting in an area increase of 7.9 square inches.

Example 15

Spectar and Provista were individually laminated at 140° C., 21000 lbs of ram force, for a time of 30 seconds heating after reaching a temperature within 10° C. of the setpoint. For Spectar, the initial area was 144.3 square inches and increased to a final area of 170.8 square inches resulting in an area increase of 26.5 square inches. For Provista, the initial area was 144.4 square inches and increased to a final area 161.8 square inches resulting in an area increase of 17.4 square inches.

Example 16

Spectar and Provista were individually laminated at 140° C., 16000 lbs of ram force, for a time of 60 seconds heating after reaching a temperature within 10° C. of the setpoint. For Spectar, the initial area was 144.4 square inches and increased to a final area of 170.8 square inches resulting in an area increase of 26.5 square inches. For Provista, the initial area was 143.4 square inches and increased to a final area 160.1 square inches resulting in an area increase of 16.7 square inches.

Example 17

Spectar and Provista were individually laminated at 140° C., 7000 lbs of ram force, for a time of 90 seconds heating after reaching a temperature within 10° C. of the setpoint. For Spectar, the initial area was 144.2 square inches and increased to a final area of 165.5 square inches resulting in an area increase of 21.3 square inches. For Provista, the initial area was 138.1 square inches and increased to a final area 150.1 square inches resulting in an area increase of 12.0 square inches.

Example 18

Spectar and Provista were individually laminated at 140° C., 21000 lbs of ram force, for a time of 90 seconds heating after reaching a temperature within 10° C. of the setpoint. For Spectar, the initial area was 145.2 square inches and increased to a final area of 180.1 square inches resulting in an area increase of 34.9 square inches. For Provista, the initial area was 144.3 square inches and increased to a final area 168.8 square inches resulting in an area increase of 24.5 square inches.

Example 19

Spectar and Provista were individually laminated at 160° C., 7000 lbs of ram force, for a time of 30 seconds heating after reaching a temperature within 10° C. of the setpoint. For Spectar, the initial area was 144.4 square inches and increased to a final area of 184.6 square inches resulting in an area increase of 40.1 square inches. For Provista, the initial area was 143.2 square inches and increased to a final area 166.2 square inches resulting in an area increase of 22.9 square inches.

Example 20

Spectar and Provista were individually laminated at 160° C., 21000 lbs of ram force, for a time of 30 seconds heating after reaching a temperature within 10° C. of the setpoint. For Spectar, the initial area was 144.5 square inches and increased to a final area of 213.1 square inches resulting in an area increase of 68.7 square inches. For Provista, the initial area was 144.3 square inches and increased to a final area 194.7 square inches resulting in an area increase of 50.4 square inches.

Example 21

Spectar and Provista were individually laminated at 160° C., 7000 lbs of ram force, for a time of 90 seconds heating after reaching a temperature within 10° C. of the setpoint. For Spectar, the initial area was 144.5 square inches and increased to a final area of 201.4 square inches resulting in an area increase of 57.0 square inches. For Provista, the initial area was 143.2 square inches and increased to a final area 177.8 square inches resulting in an area increase of 34.6 square inches.

Example 22

Prophetic

A UV copolyester film is laminated to the top surface of a two sheets of polymer and the entire structure is laminated according to the layup described above and process conditions described in example 1. The use of a branched polymer resulted in less flow and less thinning of both the UV film and the sheet thereby saving cost and waste in material utilization while maintaining optimum performance. The optimum performance is maintained because the UV film flows and becomes thinner resulting in poor weathering as the layer thickness decreased too much to protect the laminate.

Example 23

Prophetic

A graphics film is an inclusion between two sheets of polymers and laminated according to the layup described above and process conditions described in example 1. The use of a branched polymer resulted in less flow and no distortion to the graphic. When using non-branched polymers, the polymer flows more and distorts the graphic.

Example 24

Prophetic

A paper inclusion is inserted between two sheets of polymers and laminated according to the layup described above and process conditions described in example 1. When using the branched resins, the polymers do not flow as much and the paper inclusion does not tear or distort. When using non branched resins, the paper inclusion is damaged by the lamination process.

TABLE 1

| | Setup Conditions | | | Spectar | | | | Provista | | | |
|---|---|---|---|---|---|---|---|---|---|---|---|
| Example # | Temp (° C.) | Time (seconds) | Ram Force (lbs) | Pressure (lbs/in$^2$) | Init Area (in$^2$) | Final Area (in$^2$) | Δ Area (in$^2$) | Pressure (lbs/in$^2$) | Init Area (in$^2$) | Final Area (in$^2$) | Δ Area (in$^2$) |
| 1 | 120 | 30 | 7000 | 48.5 | 144.3 | 147.0 | 2.8 | 48.5 | 144.4 | 146.5 | 2.2 |
| 2 | 120 | 30 | 21000 | 152.6 | 144.6 | 142.9 | 5.3 | 145.3 | 144.5 | 148.4 | 3.9 |
| 3 | 120 | 90 | 7000 | 48.6 | 144.2 | 147.0 | 2.8 | 48.6 | 144.1 | 146.7 | 2.6 |
| 4 | 120 | 90 | 21000 | 145.5 | 144.3 | 150.3 | 6.0 | 146.7 | 143.2 | 147.7 | 4.5 |

TABLE 1-continued

| | Setup Conditions | | | Spectar | | | | Provista | | | |
|---|---|---|---|---|---|---|---|---|---|---|---|
| Example # | Temp (° C.) | Time (seconds) | Ram Force (lbs) | Pressure (lbs/in²) | Init Area (in²) | Final Area (in²) | Δ Area (in²) | Pressure (lbs/in²) | Init Area (in²) | Final Area (in²) | Δ Area (in²) |
| 5 | 140 | 30 | 7000 | 48.5 | 144.4 | 160.8 | 16.4 | 48.9 | 143.1 | 151.1 | 7.9 |
| 6 | 140 | 30 | 21000 | 145.5 | 144.3 | 170.8 | 26.5 | 145.4 | 144.4 | 161.8 | 17.4 |
| 7 | 140 | 60 | 14000 | 97.0 | 144.4 | 170.8 | 26.5 | 97.6 | 143.4 | 160.1 | 16.7 |
| 8 | 140 | 90 | 7000 | 48.5 | 144.2 | 165.5 | 21.3 | 50.7 | 138.1 | 150.1 | 12.0 |
| 9 | 140 | 90 | 21000 | 144.6 | 145.2 | 180.1 | 34.9 | 145.6 | 144.3 | 168.8 | 24.5 |
| 10 | 160 | 30 | 7000 | 48.5 | 144.4 | 184.6 | 40.1 | 48.9 | 143.2 | 166.2 | 22.9 |
| 11 | 160 | 30 | 21000 | 145.4 | 144.5 | 213.1 | 68.7 | 145.5 | 144.3 | 194.7 | 50.4 |
| 12 | 160 | 90 | 7000 | 48.5 | 144.5 | 201.4 | 57.0 | 48.9 | 143.2 | 177.8 | 34.6 |

The data show consistently less flow of the laminate sheets when branched resins are used. This will result in less distortion of interlayer materials and better retention of hard coated or UV surface layers. The use of branched polymers whether polyesters, polycarbonates, blends etc. results in less flow during the lamination process and better overall dimensional stability. This improvement leads to a reduction cycle time and reduced material waste while also protecting appearance and function of inclusions and functional surface layers.

This invention can be further illustrated by the following examples of preferred embodiments thereof, although it will be understood that these examples are included merely for purposes of illustration and are not intended to limit the scope of the invention unless otherwise specifically indicated. The starting materials are commercially available unless otherwise indicated.

The invention claimed is:

1. A method of making an encapsulated electrically energized device, the method comprising:
   (a) providing a first layer and a second layer, each layer independently comprising a polyester, a polycarbonate, a polyacrylate, or a polycarbonate/polyester miscible blend;
   (b) providing an electrically energized device having a surface area ranging from greater than 1 square foot (0.93 square meters) and less than 120 square feet (11.2 square meters) between the first and second layers; and
   (c) applying pressure ranging from 5 psig to 750 psig at a temperature ranging from 180° F. to 425° F. for a period ranging from 5 minutes to 45 minutes to a perimeter of the surface of the first and second layers to thermocompressively fuse the first and second layers to encapsulate the electrically energized device;
   wherein the perimeter does not overlap the electrically energized device,
   wherein the first and second layers do not bond to the electrically energized device,
   wherein the first and second layers each independently has a thickness ranging from 15 mil to 375 mil,
   wherein the temperature at an interface of the first and second layers in step (c) is equal to or greater than the Tg of the first layer and the second layer, and
   wherein the first and second layers increase in width and/or length less than 5% relative to the initial width or length of the first and second layers.

2. The method of claim 1, wherein at least one of the first and second layers comprises a polyester comprising:
   (a) a diacid component comprising:
      (i) at least 80 mole percent of terephthalic acid residues; and
      (ii) up to 20 mole percent of residues of one or more other dicarboxylic acids, and
   (b) a diol component comprising:
      (i) 1 to 98 mole percent of ethylene glycol residues;
      (ii) 2 to 99 mole percent of 1,3- and/or 1,4-cyclohexanedimethanol residues; and
      (iii) up to 20 mole percent of residues of one or more other diols,
   wherein the sum of the diacid residues is equal to 100 mole percent of the diacid component and the sum of the diol residues is equal to 100 mole percent of the diol component.

3. The method of claim 2, wherein the other dicarboxylic acids comprise phthalic acid, isophthalic acid, 1,4-, 1,5-, 2,6- or 2,7-naphthalenedicarboxylic acid, 1,3- or 1,4-cyclohexanedicarboxylic acid, cyclohexanediacetic acid, trans-4,4'-stilbenedicarboxylic acid, 4,4'-oxydibenzoic acid, 3,3'- or 4,4'-bi-phenyldicarboxylic acid, malonic acid, succinic acid, glutaric acid, adipic acid, pimelic acid, suberic acid, azelaic acid, sebacic acid, nonanedicarboxylic acid, decanedicarboxylic acid, or dodecanedicarboxylic acid.

4. The method of claim 2, wherein the other diols comprise 1,2-propanediol, 1,3-propanediol, neopentyl glycol, 2-methyl-1,3-propanediol, 1,4-butanediol, 1,5-pentanediol, 1,6-hexanediol, 2,2,4,4-tetramethyl-1,3-cyclobutanediol, or p-xylylene glycol.

5. The method of claim 2, wherein the polyester has an inherent viscosity of 0.5 to 1.2 dL/g measured by dissolving 0.50 g of the polyester in 100 mL of a solvent consisting of 60% by weight phenol and 40% by weight tetrachloroethane at 25° C.

6. The method of claim 2, wherein the first layer and the second layer comprise the same polyester.

7. The method of claim 6, wherein the polyester layers have a flow during encapsulation that is less than the flow that induces fractures in the electrically energized device.

8. The method of claim 6, wherein the polyester layers have a flow during encapsulation that is less than the flow that induces burn-through in the electrically energized device.

9. A laminated article which is made according to the method of claim 6.

10. A laminated article which is made according to the method of claim 2.

11. The method of claim 1, wherein the electrically energized device comprises a light emitting capacitor (LEC), light emitting diode (LED), printed "circuit board" that emit light when energized, electrochromic layer, photovoltaic, transmitter, receiver, antenna, electromagnet, electrode and smart sensor capable of detecting wind speed and direction, temperature, pressure, relative humidity, rainfall, motion, radiation, specific chemical species or combinations thereof.

12. The method of claim 1, wherein the electrically energized device comprises an LEC.

13. A laminated article which is made according to the method of claim 12.

14. A laminated article which is made according to the method of claim 1.

15. A method of making an encapsulated electrically energized device, the method comprising:
   (a) providing a first layer and a second layer, each layer independently comprising a polyester, a polycarbonate, a polyacrylate, or a polycarbonate/polyester miscible blend;
   (b) providing an electrically energized device having a surface area ranging from greater than 1 square foot (0.93 square meters) and less than 120 square feet (11.2 square meters) between the first and second layers;
   (c) providing a shim around the electrically energized device between the first and second layers; and
   (d) applying pressure ranging from 5 psig to 750 psig at a temperature ranging from 180° F. to 425° F. for a period ranging from 5 minutes to 45 minutes to a perimeter of the surface of the first and second layers to thermocompressively fuse the first and second layers to encapsulate the electrically energized device;
   wherein the perimeter does not overlap the electrically energized device,
   wherein the first and second layers each independently has a thickness ranging from 15 mil to 375 mil,
   wherein the temperature at an interface of the first and second layers in step (c) is equal to or greater than the Tg of the first layer and the second layer, and
   wherein the first and second layers increase in width and/or length less than 5% relative to the initial width or length of the first and second layers.

16. The method of claim 15, wherein the shim has about the same thickness as the electrically energized device.

17. The method of claim 15, wherein the shim comprises the same composition as the first or second layers or both.

18. A laminated article which is made according to the method of claim 15.

19. A method of making an encapsulated electrically energized device, the method comprising:
   (a) providing a first layer and a second layer, each layer independently comprising a polyester, a polycarbonate, a polyacrylate, or a polycarbonate/polyester miscible blend;
   (b) providing an electrically energized device having a surface area ranging from greater than 1 square foot (0.93 square meters) and less than 120 square feet (11.2 square meters) between the first and second layers;
   (c) providing a metal frame around the electrically energized device; and
   (d) applying pressure ranging from 5 psig to 750 psig at a temperature ranging from 180° F. to 425° F. for a period ranging from 5 minutes to 45 minutes to a perimeter of the surface of the first and second layers to thermocompressively fuse the first and second layers to encapsulate the electrically energized device;
   wherein the perimeter does not overlap the electrically energized device,
   wherein the metal frame concentrates the pressure on the perimeter of the first and second layers, and away from the electrically energized device,
   wherein the first and second layers each independently has a thickness ranging from 15 mil to 375 mil,
   wherein the temperature at an interface of the first and second layers in step (c) is equal to or greater than the Tg of the first layer and the second layer, and
   wherein the first and second layers increase in width and/or length less than 5% relative to the initial width or length of the first and second layers.

20. A laminated article which is made according to the method of claim 19.

* * * * *